(12) United States Patent
Fackenthal

(10) Patent No.: US 11,770,923 B2
(45) Date of Patent: Sep. 26, 2023

(54) THIN FILM TRANSISTOR RANDOM ACCESS MEMORY

(71) Applicant: Micron Technology, Inc., Boise, ID (US)

(72) Inventor: Richard E. Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 188 days.

(21) Appl. No.: 17/191,446

(22) Filed: Mar. 3, 2021

(65) Prior Publication Data

US 2022/0285367 A1 Sep. 8, 2022

(51) Int. Cl.
| | | |
|---|---|---|
| *H10B 10/00* | (2023.01) | |
| *H01L 23/528* | (2006.01) | |
| *H01L 27/092* | (2006.01) | |
| *H01L 21/8238* | (2006.01) | |
| *H01L 29/66* | (2006.01) | |
| *H01L 29/786* | (2006.01) | |

(52) U.S. Cl.
CPC ... *H10B 10/125* (2023.02); *H01L 21/823871* (2013.01); *H01L 21/823885* (2013.01); *H01L 23/528* (2013.01); *H01L 27/092* (2013.01); *H01L 29/66742* (2013.01); *H01L 29/78642* (2013.01)

(58) Field of Classification Search
None
See application file for complete search history.

(56) References Cited

U.S. PATENT DOCUMENTS

| | | | |
|---|---|---|---|
| 10,971,505 B1* | 4/2021 | Chang | H01L 27/1108 |
| 2005/0253143 A1 | 11/2005 | Takaura et al. | |
| 2011/0034017 A1 | 2/2011 | Moniwa et al. | |
| 2014/0225171 A1 | 8/2014 | Ellis et al. | |
| 2018/0033792 A1* | 2/2018 | Masuoka | H01L 27/1104 |
| 2018/0061835 A1* | 3/2018 | Yang | G11C 11/403 |

(Continued)

OTHER PUBLICATIONS

"International Search Report and Written Opinion of the International Searching Authority," issued in connection with Int'l Appl. No. PCT/US2022/070571, dated Jun. 7, 2022 (12 pages).

(Continued)

*Primary Examiner* — Hsien Ming Lee
(74) *Attorney, Agent, or Firm* — Holland & Hart LLP

(57) ABSTRACT

Methods, systems, and devices for thin film transistor random access memory are described. A memory device may include memory cells each having one or more transistors formed above a substrate. For example, a memory cell may include a transistor having a channel portion formed by one or more pillars or other structures formed above a substrate, and a gate portion including a conductor formed above the substrate and configured to activate the channel portion based at least in part on a voltage of the gate portion. A memory cell may include a set of two or more such transistors to support latching circuitry of the memory cell, or other circuitry configured to store a logic state, which may or may not be used in combination with one or more transistors formed at least in part from one or more portions of a substrate.

14 Claims, 22 Drawing Sheets

(56) References Cited

U.S. PATENT DOCUMENTS

2019/0096894 A1  3/2019 Bell et al.
2020/0343249 A1  10/2020 Bell

OTHER PUBLICATIONS

Taiwanese Patent Office, "Office Action," issued in connection with Taiwanese Patent Application No. 111105219 dated Dec. 7, 2022 (11 pages) (5 pages of English Translation and 6 pages of Original Document).

* cited by examiner

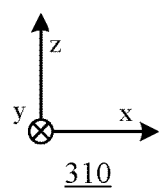
310
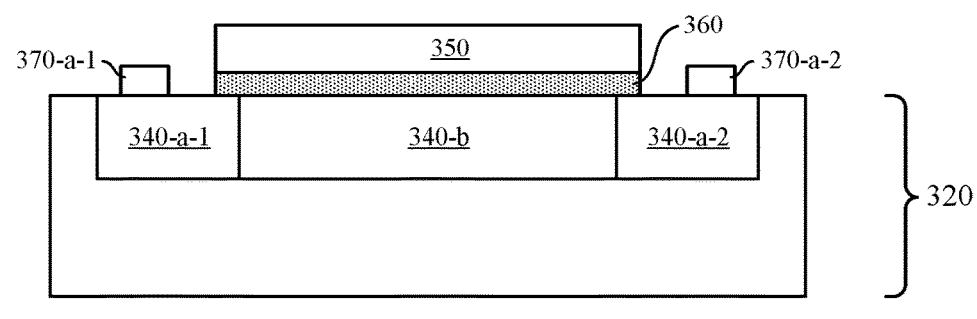
300
FIG. 3

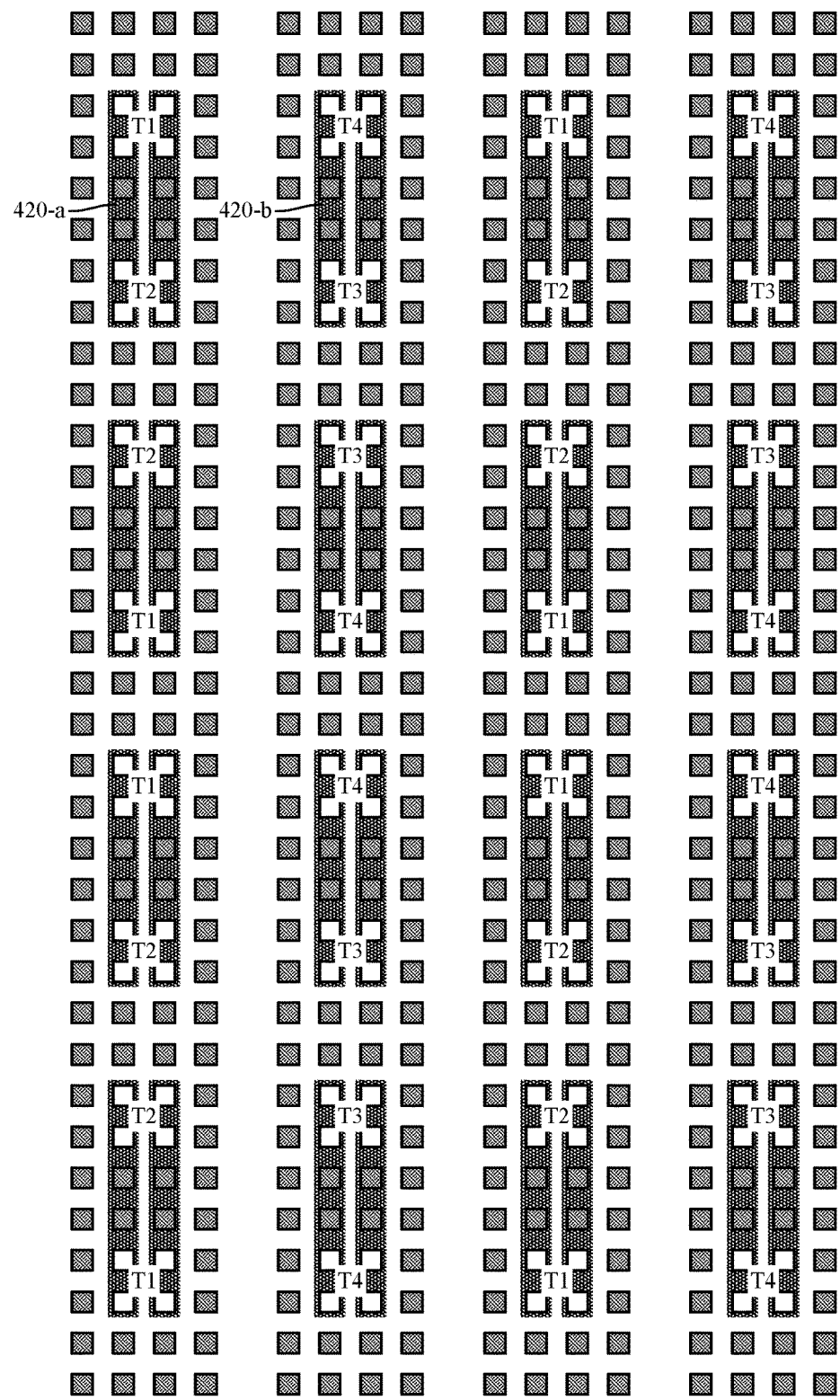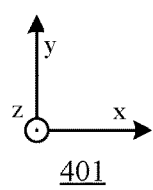
FIG. 4C

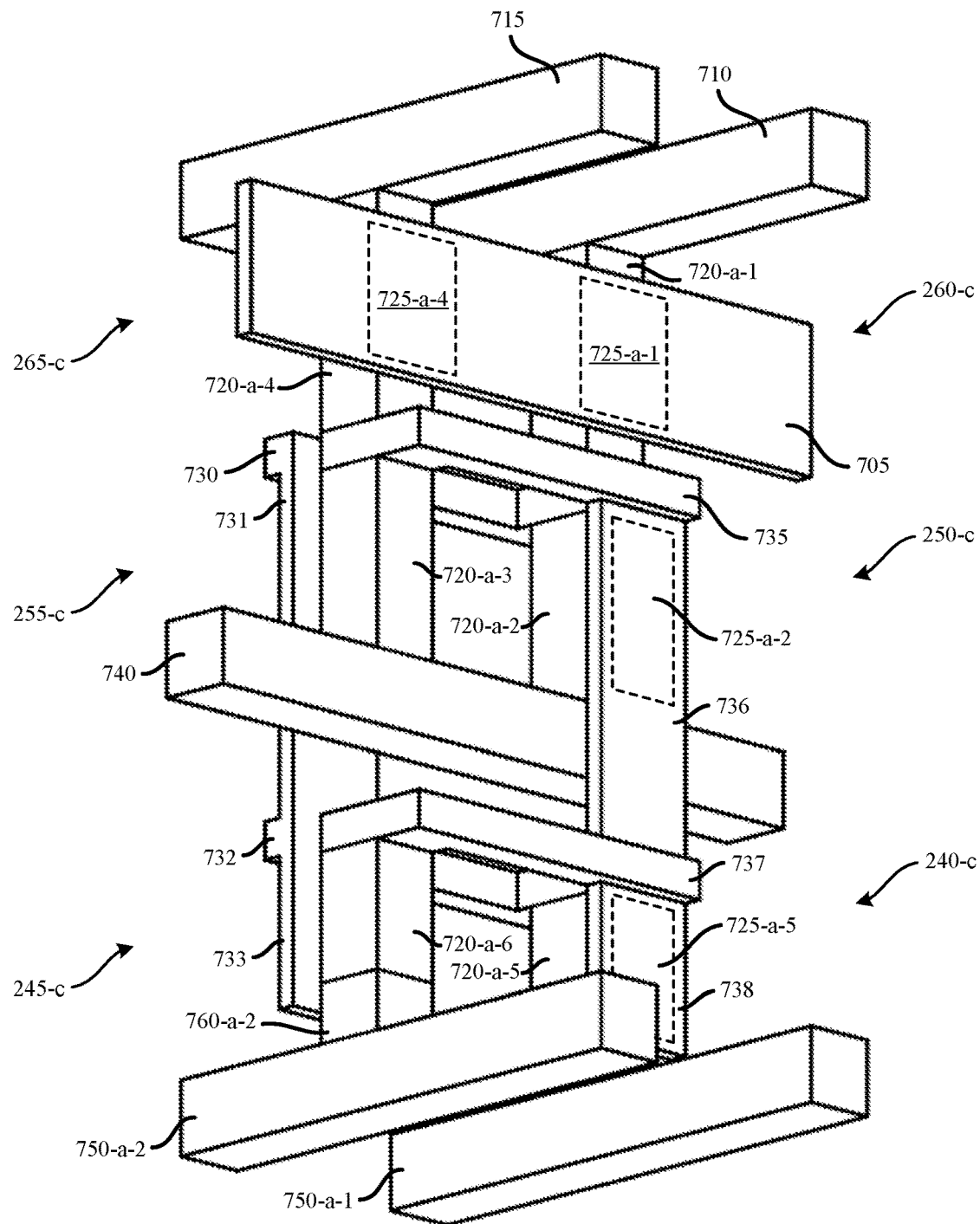
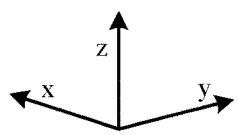
FIG. 7B

Form a memory cell comprising a plurality of transistors configured to store a logic state Form a first set of one or more transistors, each comprising a respective gate portion including a conductor formed above a substrate, and each comprising a respective channel portion including a pillar formed above the substrate and configured to be activated based at least in part on a voltage of the respective gate portion Form a second set of one or more transistors, each comprising a respective gate portion including a conductor formed above the substrate, and each comprising a respective channel portion including a doped portion of the substrate that is configured to be activated based at least in part on a voltage of the respective gate portion

905

900

FIG. 9

THIN FILM TRANSISTOR RANDOM ACCESS MEMORY

FIELD OF TECHNOLOGY

The following relates generally to a system that includes at least one memory device and more specifically to thin film transistor random access memory.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

BRIEF DESCRIPTION OF THE DRAWINGS

FIG. 3 illustrates an example of a transistor structure that may support thin film transistor random access memory in accordance with examples as disclosed herein.

FIGS. 4A through 4F provide illustrations of a memory structure that may support thin film random access memory in accordance with examples as disclosed herein.

FIGS. 7A and 7B provide illustrations of a memory structure that may support thin film random access memory in accordance with examples as disclosed herein.

FIGS. 9 and 10 show flowcharts illustrating a method or methods that support thin film transistor random access memory in accordance with examples as disclosed herein.

DETAILED DESCRIPTION

Figure 1:
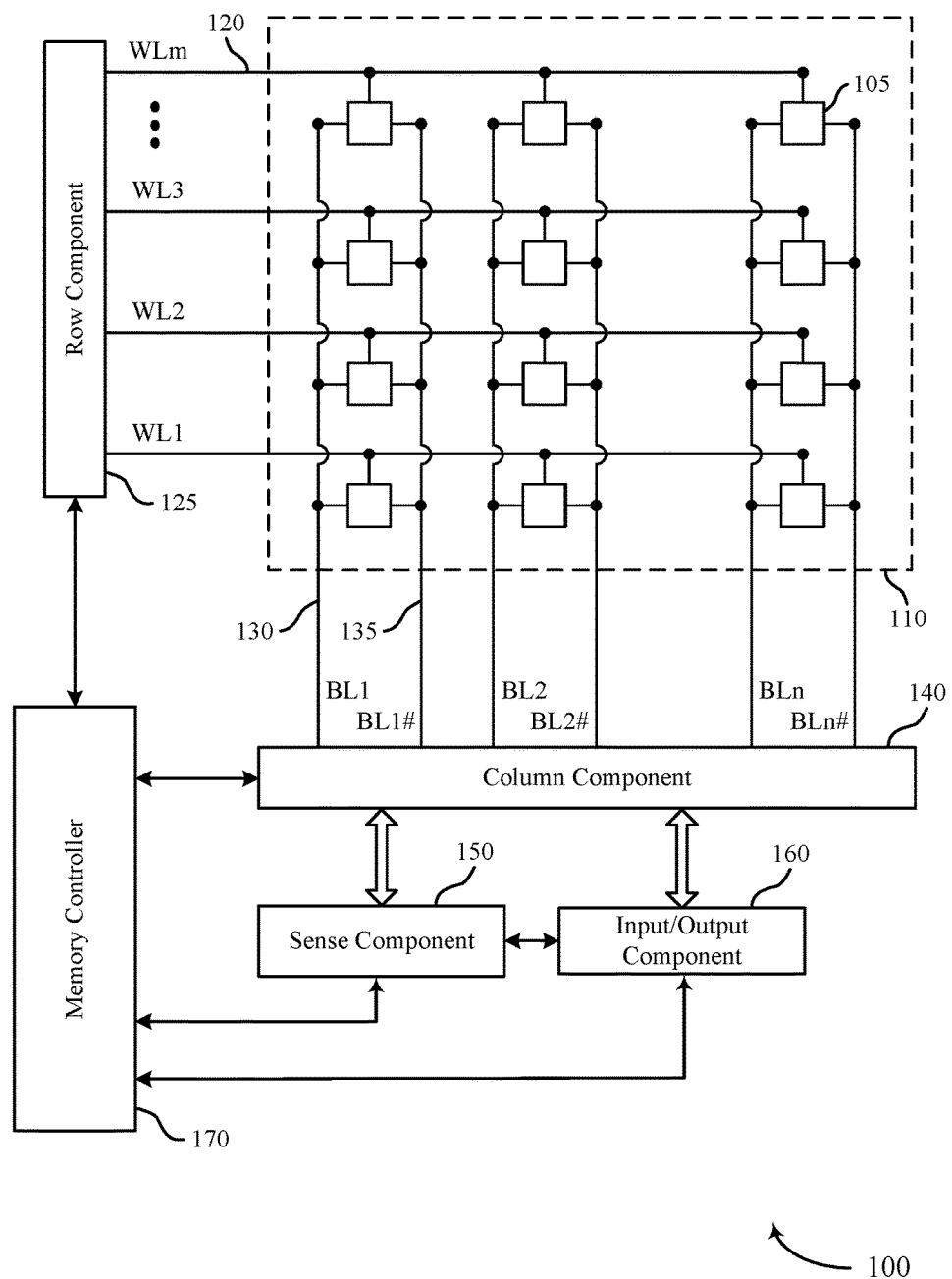
FIG. 1 illustrates an example of a memory device that supports thin film transistor random access memory in accordance with examples as disclosed herein.

A memory device may include an array of memory cells that are each configured to store one or more logic states. Memory cells may implement various storage architectures, including architectures operable to store a charge representative of a stored logic state, architectures operable to be configured in a material state (e.g., a degree of crystallinity, a degree of ion migration or distribution) representative of a stored logic state, or architectures operable to be configured with electrical characteristics (e.g., resistance, threshold voltage) representative of a stored logic state, among other storage architectures. In some examples, such as SRAM architectures, a memory cell may be configured with a set of transistors (e.g., one or more transistors) operable to store a charge or bias associated with a stored logic state (e.g., in latching circuitry of the memory cell). Unless otherwise stated herein, a "set" may include one or more elements. Transistors of such memory cells may be formed at least in part by portions of a semiconductor substrate, such as planar transistors or other transistor configurations, where a channel portion may be formed by one or more doped portions of a substrate (e.g., one or more portions of a substrate having n-type doped silicon, one or more portions of a substrate having p-type doped silicon, or a combination thereof). In some memory architectures, however, implementing such transistors across a substrate may be associated with practical limitations such as limitations on density of memory cells across the area of a substrate, limitations on extending a memory array or associated device in a height dimension (e.g., relative to a substrate, or one or more stacked substrates or chips, in a direction perpendicular to a plane of the substrate), or limitations for arranging access lines for accessing memory cells, among other limitations.

In accordance with examples as disclosed herein, a memory device may include one or more memory cells each having one or more transistors formed above a substrate, which may be or be referred to as thin film transistors, or vertical transistors, among other configurations or terminology. For example, a memory cell may include a transistor having a channel portion formed by one or more pillars or other structures formed above a substrate (e.g. formed at least in part by a polycrystalline semiconductor such as polysilicon), and a gate portion including a conductor formed above the substrate (e.g., adjacent the channel portion, alongside the channel portion, separated from the channel structure by a gate dielectric) and configured to activate the channel portion (e.g., open or close a conductive path of the channel portion) based at least in part on a voltage of the gate portion. In some examples, a memory cell may include a set of two or more such transistors to support latching circuitry of the memory cell, or other circuitry configured to store a logic state, which may or may not be used in combination with one or more transistors formed at least in part from a respective portion of a substrate (e.g., transistors configured in a planar arrangement, transistors having a channel portion formed at least in part by a crystalline semiconductor, such as monocrystalline silicon). By implementing transistors of a memory cell above a substrate, such as thin-film transistors or vertical transistors in one or more layers or levels above a substrate, various aspects of a memory device may be improved, such as increasing density of memory cells on a substrate (e.g., increasing area density), enabling transistor structures of memory cells to be extended or stacked vertically relative to a substrate, enabling different repetition or configuration of transistor structures for particular electrical characteristics or manufacturing characteristics, improving design flexibility for interconnecting memory cells or groups thereof (e.g., with circuitry for operating the memory cells, via various arrangements of access lines), or any combination thereof, among other benefits.

Figure 2A:
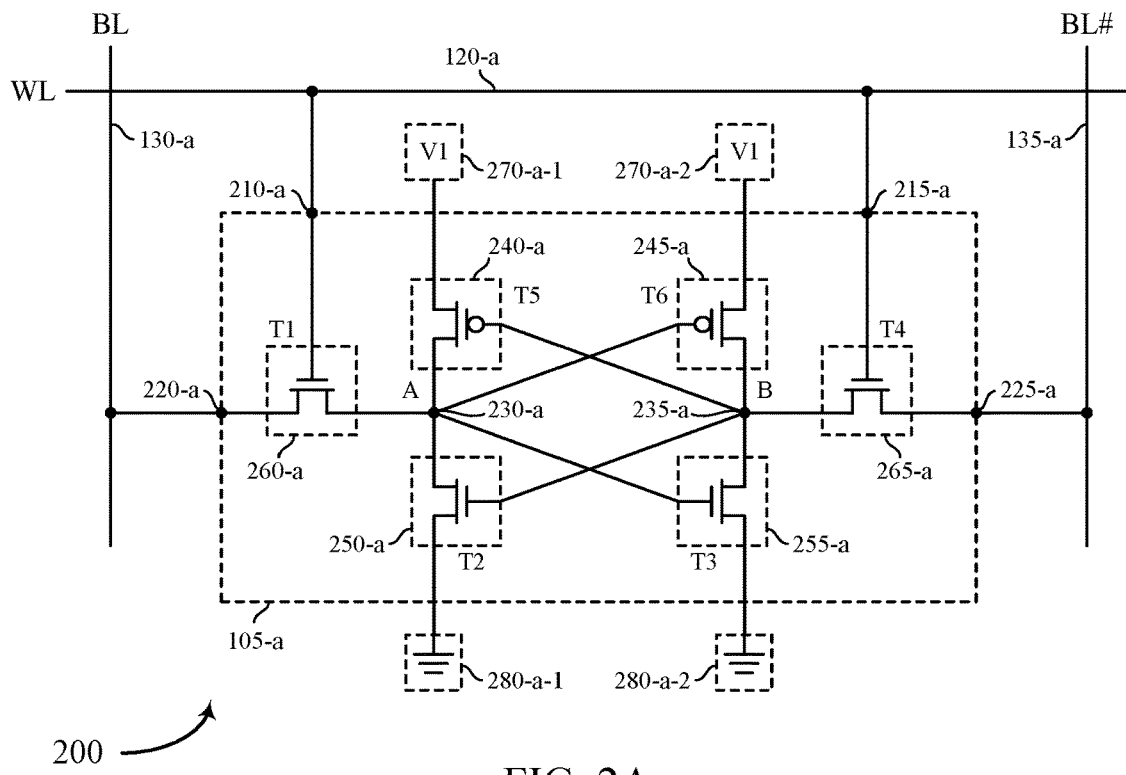
FIGS. 2A and 2B illustrate examples of circuits that support thin film transistor random access memory in accordance with examples as disclosed herein.
Figure 2B:
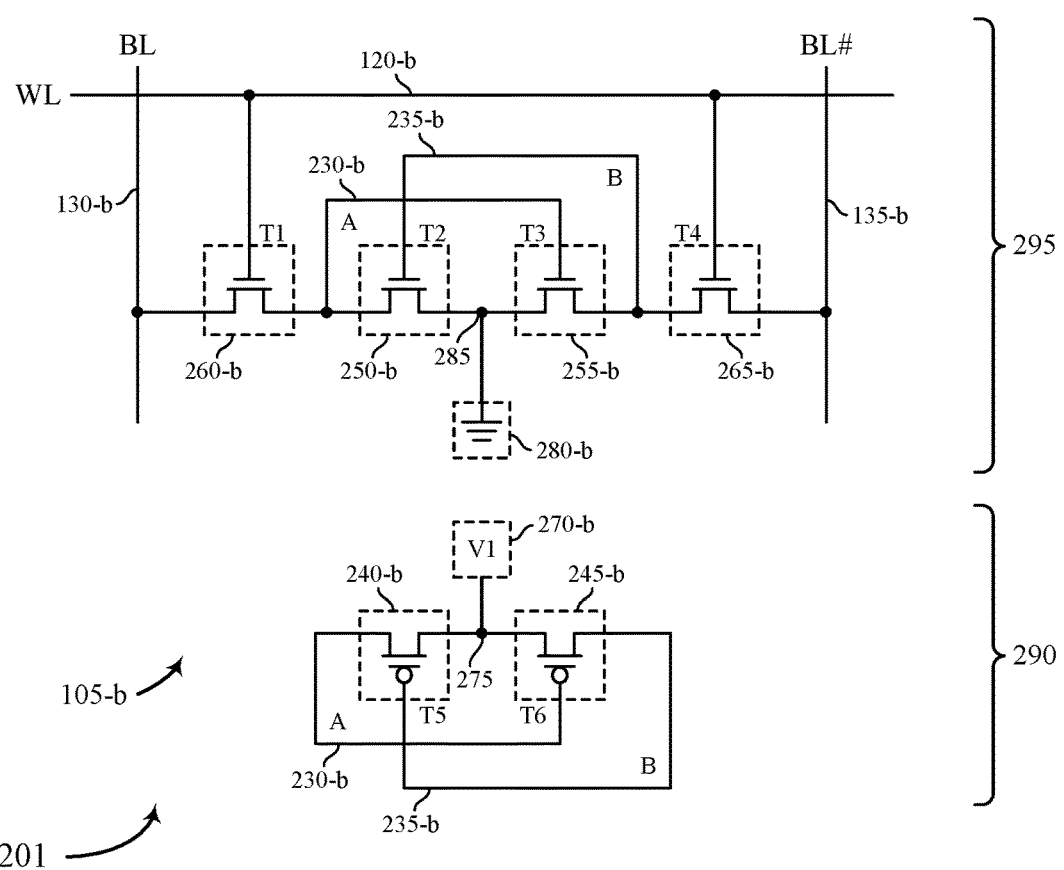

Features of the disclosure are initially described in the context of an example of a memory device and applicable memory cell circuits with reference to FIGS. 1, 2A, and 2B. Features of the disclosure are described in the context of examples of memory structures with reference to FIGS. 3, 4A through 4F, 5A through 5E, 6A and 6B, 7A and 7B, and 8A and 8B. Examples of methods of formation that relate to thin film transistor random access memory are described with references to FIGS. 9 and 10.

FIG. 1 illustrates an example of a memory device 100 that supports thin film transistor random access memory in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing a charge or voltage difference in one or more capacitors, storing a charge or voltage difference in or between one or more transistors). In an SRAM memory architecture, for example, a memory cell 105 may include latching circuitry, such as a set of transistors in a flip-flop arrangement, and an electric charge or bias may be stored or latched between nodes of the latching circuitry (e.g., a charge difference stored between nodes of or internal to the memory cell 105). Transistor-based memory architectures, such as SRAM memory architectures, may include volatile configurations or non-volatile configurations, and may be characterized by transistor quantity (e.g., a 4-transistor arrangement, a 6-transistor arrangement, an 8-transistor arrangement, a 10-transistor arrangement), by transistor type (e.g., bipolar junction transistors (BJTs), metal oxide semiconductor field effect transistors (MOSFETs)), by flip-flop type (e.g., binary SRAM, ternary SRAM), and other characteristics. Different levels or polarities of charge or bias stored using transistors of a memory cell 105 may represent different logic states (e.g., supporting two or more logic states in a respective memory cell 105).

In the example of memory device 100, each row of memory cells 105 may be coupled with one or more word lines 120 (e.g., WL1 through WLm), and each column of memory cells 105 may be coupled with one or more bit lines 130 (e.g., BL1 through BLn) and one or more bit lines 135 (e.g., BL1 # through BLn #). In some examples, a bit line 135 may be referred to as a complementary bit line, an inverse bit line, or as a bit line "bar" (e.g., BL), among other terminology or reference. Each of the word lines 120, bit lines 130, and bit lines 135 may be an example of an access line of the memory device 100. In general, one memory cell 105 may be located at the intersection of (e.g., coupled with, coupled between) a word line 120 and a pair formed by a bit line 130 and an associated or corresponding bit line 135 (e.g., a pair of bit lines consisting of BL1 and BL1 #, which may correspond to a first column of the memory array 110 or a first column of memory cells 105). This intersection may be referred to as an address of a memory cell 105. A target or selected memory cell 105 may be a memory cell 105 located at the intersection of an energized or otherwise selected word line 120 and an energized or otherwise selected pair of a bit line 130 and a bit line 135.

In some architectures, a storage component of a memory cell 105 (e.g., a storage element, a memory element) may be electrically isolated (e.g., selectively isolated) from a bit line 130, or a bit line 135, or both a bit line 130 and a bit line 135, by one or more cell selection components, each of which may be referred to as a switching component or a selector device of or otherwise associated with the memory cell 105. A word line 120 may be coupled with the one or more cell selection components (e.g., via a control node or terminal of the cell selection component or cell selection components), and may control the one or more cell selection components of or otherwise associated with the memory cell 105. For example, a cell selection component of a memory cell 105 may be a transistor and the word line 120 may be coupled with a gate of the transistor (e.g., where a gate node or terminal of the transistor may be a control node or terminal of the transistor). Activating a word line 120 may result in an electrical connection or closed circuit between a respective storage component of one or more memory cells 105 and one or more corresponding bit lines 130 or bit lines 135. A bit line 130, a bit line 135, or a bit line 130 and a bit line 135 may then be accessed to read from or write to the respective memory cell 105.

Access operations such as reading, writing, rewriting, and refreshing may be performed on a memory cell 105 by activating or selecting a word line 120, a bit line 130, or a bit line 135 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a charge-storing memory element storing a logic state may be selected, and the resulting transfer of or coupling of charge between the memory element and a bit line 130, or a bit line 135, or both a bit line 130 and a bit line 135, may be detected to determine the logic state stored by the memory cell 105 (e.g., comparing a voltage or charge transfer between a bit line 130 and a bit line 135 coupled with or otherwise corresponding to the memory cell 105).

Accessing memory cells 105 may be controlled through a row component 125 (e.g., a row decoder, a row multiplexer), a column component 140 (e.g., a column decoder, a column multiplexer), or a combination thereof. For example, a row component 125 may receive a row address from the memory controller 170 and activate the appropriate word line 120 based on the received row address. Similarly, a column component 140 may receive a column address from the memory controller 170 and activate the appropriate bit line 130, or appropriate bit line 135, or both (e.g., coupling a target bit line 130, a target bit line 135, or both with the sense component 150).

In some examples, the memory controller 170 may control operations (e.g., read operations, write operations, rewrite operations, refresh operations) of memory cells 105 by using one or more components (e.g., row component 125, column component 140, sense component 150). In some cases, a row component 125, a column component 140, or a sense component 150, or various combinations thereof may be co-located or otherwise included with the memory controller 170. The memory controller 170 may generate row and column address signals to activate a target word line 120, bit line 130, or bit line 135. The memory controller 170 may also generate or control various voltages or currents used during the operation of memory device 100. In various examples, a memory controller 170 may perform access operations in response to commands received from a host device (e.g., a device external to the memory device 100 that may issue commands such as read commands, write commands, or refresh commands, among other commands), or may perform access operations based on determinations made at the memory device 100 (e.g., memory management operations, which may be controlled by the memory controller 170).

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105 (e.g., a current or charge transfer with a bit line 130, a current or charge transfer with a bit line 135, a comparison of a current or charge transfer with a bit line 130 with a current or charge transfer with a bit line 135), or a voltage resulting from coupling the memory cell 105 with the sense component 150 (e.g., a voltage of a bit line 130, a voltage of a bit line 135, a comparison between a voltage of a bit line 130 and a voltage of a bit line 135), responsive to a read operation. The sense component 150 may provide an output signal indicative of the logic state read from the memory cell 105 to one or more components (e.g., to the column component 140, the input/output component 160, to the memory controller 170).

A sense component 150 may include various switching components, selection components, transistors, amplifiers, capacitors, resistors, or voltage sources to detect or amplify a difference in sensing signals, e.g., a difference between a read voltage and a reference voltage, a difference between a read current and a reference current, a difference between a read charge and a reference charge, a difference between a charge or current of a bit line 130 and a charge or current of a bit line 135), which, in some examples, may be referred to as latching. In some examples, a sense component 150 may include a collection of components (e.g., circuit elements) that are repeated for a quantity of bit line pairs (e.g., a pair of a bit line 130 and a corresponding bit line 135) that may be connected to the sense component 150. For example, a sense component 150 may include a separate sensing circuit (e.g., a separate or duplicated sense amplifier, a separate or duplicated signal development component) for a quantity of bit line pairs that may be coupled with the sense component 150 via the column component 140 (e.g., a multiplexed or decoded quantity of bit line pairs), such that a logic state may be separately detected for an activated or selected memory cell 105 coupled with a connected bit line pair.

A memory cell 105 may be set, or written, by activating the relevant word line 120, bit line 130, or bit line 135 (e.g., via a memory controller 170). In other words, a logic state may be stored in or written to a memory cell 105. A row component 125 or a column component 140 may accept data, for example, via input/output component 160, to be written to the memory cells 105. In various examples, a write operation may be performed at least in part by a sense component 150, or a write operation may be configured to bypass a sense component 150. In the case of a charge-storing memory element, a memory cell 105 may be written by applying a voltage to one or more nodes of the memory cell 105 (e.g., internal nodes of a transistor network or latching circuitry of the memory cell 105), and then isolating the nodes of the memory cell 105 to store a charge associated with a desired logic state.

In some examples, transistors of a memory cell 105 may be formed at least in part by portions of a semiconductor substrate, such as planar transistors or other transistor configurations, where a channel portion is formed by one or more doped portions of a substrate (e.g., one or more portions of a substrate having n-type doped silicon, one or more portions of a substrate having p-type doped silicon, or a combination thereof). In some examples, terminals of such a transistor, such as a gate terminal, a source terminal, a drain terminal, or a combination thereof, may be formed at least in part by conductors that may be formed over the substrate. However, in some memory architectures, implementing such transistors across a substrate for memory cells 105 may be associated with practical limitations such as limitations on density of memory cells 105 on the area of a substrate, or limitations on extending a memory array 110 or a memory device 100 in a height dimension relative to a substrate (e.g., in a direction perpendicular to a plane of the substrate), or limitations for arranging groups of memory cells 105 or access lines for accessing memory cells 105, among other limitations.

In accordance with examples as disclosed herein, a memory device 100 may include one or more memory cells 105 each having one or more transistors formed above a substrate, which may be or be referred to as thin film transistors, or vertical transistors, among other configurations or terminology. For example, a memory cell 105 may include a transistor having a channel portion formed by one or more pillars or other channel structures formed above a substrate (e.g., structures supporting a conductive path of a channel along a direction perpendicular to or otherwise to or from a substrate), and a gate portion including a conductor formed above the substrate (e.g., adjacent the channel portion, alongside the channel portion, transverse to the channel portion, separated from the channel structure by a gate dielectric) and configured to activate the channel portion (e.g., to open or close a conductive path) based at least in part on a voltage of the gate portion. In some examples, a memory cell 105 may include a set of two or more such transistors to support latching circuitry of the memory cell 105, or other circuitry configured to store a logic state, which may or may not be used in combination with one or more transistors formed at least in part from portions of a substrate (e.g., transistors in a planar arrangement). By implementing transistors of a memory cell 105 in one or more layers or levels above a substrate, such as thin-film transistors or vertical transistors, various aspects of a memory device 100 may be improved, such as increasing density of memory cells 105 on a substrate (e.g., increasing area density), enabling transistor structures of memory cells 105 to be extended or stacked vertically relative to a substrate, or improving design flexibility for interconnecting memory cells 105 or groups thereof (e.g., with circuitry for operating the memory cells, via various arrangements of access lines), or any combination thereof, among other benefits.

FIG. 2A illustrates an example of a circuit 200 that supports thin film transistor random access memory in accordance with examples as disclosed herein. Circuit 200 includes a memory cell 105-*a* coupled with a word line 120-*a* (e.g., via a selection node 210-*a* and a selection node 215-*a* of the memory cell 105-*a*, which may be or may not be, or may be referred to as or may not be referred to as, a common selection node of the memory cell 105-*a*), with a bit line 130-*a* (e.g., via an access node 220-*a* of the memory cell 105-*a*), and with a bit line 135-*a* (e.g., via an access node 225-*a* of the memory cell 105-*a*), each of which may be an example of the respective features described with reference to FIG. 1. The memory cell 105-*a* illustrates an example of a memory cell 105 that includes a plurality of transistors configured to store a logic state. For example, the memory cell 105-*a* may be an example of an SRAM memory cell, and may be referred to as a 6-transistor or "6 T" memory cell.

In the example of memory cell 105-*a*, the illustrated configuration of transistors shows an example of latching circuitry configured to store a logic state based at least in part on latching a charge or voltage difference between a node 230-*a* (e.g., a node A, a storage node, a first node, a first node internal to the memory cell 105-*a*, a "Q" node) and a node 235-*a* (e.g., a node B, a storage node, a second node, a second node internal to the memory cell 105-*a*, a "Q̄" node). The combination or configuration of transistor 240-*a*, transistor 245-*a*, transistor 250-*a*, and transistor 255-*a* may be an example of a transistor-based, latch-based, or flip-flop-based storage component of the memory cell 105-*a* (e.g., a plurality of transistors configured to store a logic state), among other examples.

For example, a transistor 240-*a* (e.g., a "T5" transistor, a p-type transistor), or channel portion thereof, may be coupled with or between a voltage source 270-*a*-1 (e.g., a positive voltage source, which may correspond to a drain voltage, Vdd) and the node 230-*a*, and a transistor 245-*a* (e.g., a "T6" transistor, a p-type transistor), or channel portion thereof, may be coupled with or between a voltage source 270-*a*-2 (e.g., a positive voltage source) and the node 235-*a*. The transistors 240-*a* and 245-*a* may be an example of a first cross-coupled pair of transistors (e.g., a cross-coupled pair of transistors of a first type, a cross-coupled pair of p-type transistors, a pull-up latch), which may be an example of a set of transistors configured for latching a logic state (e.g., at or between the node 230-*a* and the node 235-*a*) based at least in part on the voltage sources 270-*a*-1 and 270-*a*-2. In some examples, such a cross-coupled pair of transistors may be configured to couple or latch one of the node 230-*a* or the node 235-*a* with a voltage source 270-*a*. In various examples, the voltage sources 270-*a*-1 and 270-*a*-2 may be or may not be a common voltage source, a common voltage source node, or a common voltage level. Although the voltage sources 270-*a* are illustrated as having a direct connection with the transistors 240-*a* and 245-*a*, in some examples, other circuitry may be electrically coupled between a voltage source 270 and transistors 240 and 245, or between a voltage source 270 and a memory cell 105, such as one or more switching components or one or more decoders that may be operable to couple or isolate a voltage source 270 with or from a transistor 240, a transistor 245, or a memory cell 105.

Further, a transistor 250-*a* (e.g., a "T2" transistor, an n-type transistor), or channel portion thereof, may be coupled with or between a voltage source 280-*a*-1 (e.g., a negative voltage source, a ground voltage source) and the node 230-*a*, and a transistor 255-*a* (e.g., a "T3" transistor, an n-type transistor), or channel portion thereof, may be coupled with or between a voltage source 280-*a*-2 (e.g., a negative voltage source, a ground voltage source, which may correspond to a source voltage, Vss) and the node 235-*a*. The transistors 250-*a* and 255-*a* may be an example of a second cross-coupled pair of transistors (e.g., a cross-coupled pair of transistors of a second type, a cross-coupled pair of n-type transistors, a pull-down latch), which may be an example of a set of transistors configured for latching a logic state (e.g., at or between the node 230-*a* and the node 235-*a*) based at least in part on the voltage sources 280-*a*-1 and 280-*a*-2. In some examples, such a cross-coupled pair of transistors may be configured to couple or latch one of the node 230-*a* or the node 235-*a* with a voltage source 280-*a* (e.g., the one of these nodes that is not coupled with a voltage source 270-*a*). In various examples, the voltage sources 280-*a*-1 and 280-*a*-2 may be or may not be a common voltage source, a common voltage source node, or a common voltage level. Although the voltage sources 280-*a* are illustrated as having a direct connection with the transistors 250-*a* and 255-*a*, in some examples, other circuitry may be electrically coupled between a voltage source 280 and transistors 250 and 255, or between a voltage source 280 and a memory cell 105, such as one or more switching components or decoders that may be operable to couple or isolate a voltage source 280 from a transistor 250, a transistor 255, or a memory cell 105.

In the example of memory cell 105-*a*, node 230-*a* and node 235-*a* may be accessed (e.g., for read operations, for write operations) by a transistor 260-*a* (e.g., a "T1" transistor, an n-type transistor) and a transistor 265-*a* (e.g., a "T4" transistor, an n-type transistor), respectively, which may both be activated by the word line 120-*a*. Thus, in the example of memory cell 105-*a*, each of the transistor 260-*a* and the transistor 265-*a*, or a combination or configuration of the transistor 260-*a* and the transistor 265-*a*, may be an example of a switching component, a cell selection component, or selector device of or otherwise associated with the memory cell 105-*a* (e.g., configured for accessing the memory cell 105-*a*). In some examples, a cell selection component may be considered to be outside the illustrative boundary of the memory cell 105-*a*, in which case the transistor 260-*a* or the transistor 265-*a* may be referred to as a switching component, selection component, or selector device coupled with or between an access line (e.g., the bit line 130-*a*, the bit line 135-*a*) and the memory cell 105-*a*.

Although the memory cell 105-*a* illustrates one example for transistor-based storage components and switching components of a memory cell 105, the techniques as disclosed herein are applicable to other configurations or quantities of transistors or other components implemented in such components of a memory cell 105. For example, a storage component may include different quantities of transistors (e.g., different quantities of cross-coupled pairs of transistors) for supporting multi-level memory cells 105 or other features, or a selection component may include different quantities of transistors for supporting multiple access paths or single-ended access, among other configurations or combinations thereof.

To write (e.g., store) a first logic state (e.g., a logic 0), node 230-*a* may be biased with a relatively high or positive voltage (e.g., a voltage V1, which may be applied via bit line 130-*a*) and node 235-*a* may be biased with a relatively low voltage (e.g., a ground voltage, negative voltage, or an otherwise less positive voltage, which may be applied via bit line 135-*a*). Accordingly, for the first logic state, node 230-*a* may be coupled with the voltage source 270-*a*-1 (e.g., based on a channel of the transistor 240-a being activated by the relatively low voltage of node 235-a being applied to a gate of the transistor 240-a), node 235-a may be coupled with the voltage source 280-a-2 (e.g., based on a channel of the transistor 255-a being activated by the relatively high voltage of node 230-a being applied to a gate of the transistor 255-a), node 230-a may be isolated from the voltage source 280-a-1 (e.g., based on a channel of the transistor 250-a being deactivated by the relatively low voltage of node 235-a being applied to a gate of the transistor 250-a), and node 235-a may be isolated from the voltage source 270-a-2 (e.g., based on a channel of the transistor 245-a being deactivated by the relatively high voltage of node 230-a being applied to a gate of the transistor 245-a).

To write (e.g., store) a second logic state (e.g., a logic 1), node 230-a may be biased with a relatively low voltage and node 235-a may be biased with a relatively high voltage. Accordingly, for the second logic state, node 230-a may be coupled with the voltage source 280-a-1, node 235-a may be coupled with the voltage source 270-a-2, node 230-a may be isolated from the voltage source 270-a-1, and node 235-a may be isolated from the voltage source 280-a-2.

To read a logic state of the memory cell 105-a, the memory cell 105-a may be coupled with a sense component 150 (e.g., based at least in part on activating the word line 120-a, based at least in part on activating the transistor 260-a and the transistor 265-a), which may compare or otherwise evaluate a charge or voltage of the nodes 230-a and 235-a, such as evaluating which of node 230-a or node 235-a has a relatively higher voltage or a relatively lower voltage.

FIG. 2B illustrates an example of a circuit 201 that supports thin film transistor random access memory in accordance with examples as disclosed herein. Circuit 201 includes components of a memory cell 105-b that may be coupled with a word line 120-b, with a bit line 130-b, and with a bit line 135-b, each of which may be an example of the respective features described with reference to FIG. 1. The memory cell 105-b may include transistors 240-b, 245-b, 250-b, 255-b, 260-6, and 265-b, relative to nodes 230-b and 235-b, and may be coupled with voltage sources 270-b and 280-b, each of which may be an example of the respective features as described with reference to FIG. 2A. The circuit 201 also illustrates a coupling or connection of the transistors 250-b and 250-b with a node 275 (e.g., a node of the memory cell 105-a, a ground node, a source voltage node), and a coupling or connection of the transistors 240-b and 245-b with a node 275 (e.g., a node of the memory cell 105-b, a positive voltage source node, a drain voltage node).

The example of circuit 201 illustrates an example of how components of memory cell 105-b may be distributed or allocated between a first portion 290 and a second portion 295, which may or may not be electrically equivalent to the arrangement of the corresponding components of memory cell 105-a (e.g., where the node 230-b may be shared or interconnected between the first portion 290 and the second portion 295, where the node 235-b may be shared or interconnected between the first portion 290 and the second portion 295). In the example of circuit 201, components of the first portion 290 may be formed (e.g., at least in part) from one or more portions of a substrate of a memory die, such as a silicon or other semiconductor substrate of a chip upon which a memory array 110 is formed. For example, at least a channel portion of the transistors 240-b and 245-b (e.g., p-type transistors, planar transistors) may be formed from doped portions of such a substrate (e.g., doped silicon portions of a silicon chip, doped monocrystalline semiconductor, doped monocrystalline silicon). In the example of circuit 201, components of the second portion 295 may be formed (e.g., entirely) from material portions formed above the substrate of the memory die. For example, each of the transistors 250-b, 255-b, 260-b, and 265-b (e.g., n-type transistors) may be formed from material portions that are deposited on or above the substrate of the memory die, such as including channel portions having doped material portions formed on or above the substrate (e.g., as doped semiconductor pillars, a doped polycrystalline or multicrystalline semiconductor, doped polysilicon). Thus, the circuit 201 illustrates an example where some portions or components of a memory cell 105 (e.g., at least some of first portion 290) may be formed from at least a portion of a substrate, and where some portions or components of the memory cell 105 (e.g., second portion 295) may be formed above or upon the substrate (e.g., formed entirely from materials deposited on the substrate).

Further, the circuit 201 illustrates examples where a storage component of a memory cell 105 may be formed using some substrate-based transistors (e.g., planar transistors formed at least in part on doped portions of a substrate, p-type transistors, transistors supporting a channel in a plane of a substrate) and some transistors formed above a substrate (e.g., thin film transistors, vertical transistors, n-type transistors, transistors supporting a channel along a direction to or from a substrate), which may facilitate some aspects of manufacturability or manufacturing uniformity. However, in some examples, a memory cell 105 or storage component thereof, in accordance with the described techniques, may be formed using transistors that are each formed above a substrate (e.g., a memory cell 105 or storage component thereof formed without substrate-based transistors), which may include various arrangements of transistors formed in one or more levels of transistors of a memory array 100.

FIG. 3 illustrates an example of a transistor structure 300 that may support thin film transistor random access memory in accordance with examples as disclosed herein. The transistor structure 300 illustrates an example of a transistor that is formed at least in part by portions of a substrate 320 (e.g., doped portions 340 of the substrate 320), and may illustrate an arrangement of features for a transistor that is configured in a planar transistor arrangement. The substrate 320 may be a portion of a semiconductor chip, such as a silicon chip of a memory die (e.g., crystalline silicon, monocrystalline silicon). For illustrative purposes, aspects of the transistor structure 300 may be described with reference to an x-direction, a y-direction, and a z-direction of a coordinate system 310. In some examples, the z-direction may be illustrative of a direction perpendicular to a surface of the substrate 320 (e.g., a surface in an xy-plane, a surface upon or over which other materials may be deposited), and each of the structures, illustrated by their respective cross section in an xz-plane, may extend for some distance (e.g., length) in the y-direction.

The transistor structure 300 illustrates an example of a transistor channel, electrically coupled between a terminal 370-a-1 and a terminal 370-a-2, that may include one or more doped portions 340 of the substrate 320. In various examples, one of the terminals 370-a-1 or 370-a-2 may be referred to as a source terminal, and the other of the terminals 370-a-1 or 370-a-2 may be referred to as a drain terminal, where such designation or nomenclature may be based on a configuration or relative biasing of a circuit that includes the transistor structure 300. The channel of a transistor may include or refer to one or more portions of the transistor structure that are operable to open or close a conductive path between a source and drain (e.g., between the terminal 370-*a*-1 and the terminal 370-*a*-2) based at least in part on a voltage of a gate (e.g., a gate terminal, a gate portion 350). In other words, a channel portion of a transistor structure may be configured to be activated, deactivated, made conductive, or made non-conductive, based at least in part on a voltage of a gate portion, such as gate portion 350. In some examples of transistor structure 300 (e.g., a planar transistor arrangement), the channel portion formed by one or more doped portions 340 of the substrate 320 may support a conductive path in a generally horizontal or in-plane direction (e.g., along the x-direction, within an xy-plane, in a direction within or parallel to a surface of the substrate 320).

In some examples, the gate portion 350 may be physically separated from the channel portion (e.g., separated from the substrate 320, separated from one or more of the doped portions 340) by a gate insulation portion 360. Each of the terminals 370 may be in contact with or otherwise coupled with (e.g., electrically, physically) a respective doped portion 340-*a*, and each of the terminals 370 and the gate portion 350 may be formed from an electrically conductive material such as a metal or metal alloy, or a polycrystalline semiconductor (e.g., polysilicon).

In some examples, the transistor structure 300 may be operable as an n-type or n-channel transistor, where applying a relatively positive voltage to the gate portion 350 that is above a threshold voltage (e.g., an applied voltage having a positive magnitude, relative to a source terminal, that is greater than a threshold voltage) activates the channel portion or otherwise enables a conductive path between the terminals 370-*a*-1 and 370-*a*-2 (e.g., along a direction generally aligned with the x-direction within the substrate 320). In such examples, the doped portions 340-*a* may refer to portions having n-type doping or n-type semiconductor, and doped portion 340-*b* may refer to portions having p-type doping or p-type semiconductor (e.g., a channel portion having an NPN configuration along the x-direction or channel direction).

In some examples, the transistor structure 300 may be operable as a p-type or p-channel transistor, where applying a relatively negative voltage to the gate portion 350 that is above a threshold voltage (e.g., an applied voltage having a negative magnitude, relative to a source terminal, that is greater than a threshold voltage) activates the channel portion or otherwise enables a conductive path between the terminals 370-*a*-1 and 370-*a*-2. In such examples, the doped portions 340-*a* may refer to portions having p-type doping or p-type semiconductor, and doped portion 340-*b* may refer to portions having n-type doping or n-type semiconductor (e.g., a channel portion having a PNP configuration along the x-direction or channel direction).

In some examples, a memory cell 105 may be formed from a set of transistors each having the arrangement of the transistor structure 300, where each of the transistors may have a channel portion formed by respective doped portions 340 of a substrate 320. However, such an arrangement of transistors may limit a density of memory cells 105 on a substrate, or may have limited flexibility for interconnecting transistors to form memory cells 105, rows of memory cells 105, columns of memory cells 105, or various combinations thereof, among other limitations.

In accordance with examples as disclosed herein, a memory device 100 may include memory cells 105 each having one or more transistors formed in one or more layers or levels above a substrate 320, which may include or be referred to as thin film transistors, or vertical transistors, among other configurations or terminology. In various examples, such transistors (e.g., thin film transistors, vertical transistors, transistors having polycrystalline channel portions) may or may not be combined with transistors having one or more portions formed at least in part from a substrate 320 (e.g., transistors having crystalline or monocrystalline channel portions).

For example, referring to the circuit 201, transistors 240-*b* and 245-*b* (e.g., p-type transistors, transistors of a first type) of a first portion 290 may be formed in accordance with the transistor structure 300 (e.g., in a planar transistor arrangement, supporting a channel in a direction parallel to the xy-plane, transistors having crystalline or monocrystalline channel portions), and transistors 250-*b*, 255-*b*, 260-*b*, and 265-*b* (e.g., n-type transistors, transistors of a second type) of a second portion 295 may be formed in accordance with one or more techniques described herein for forming transistors above a substrate (e.g., thin film transistors, vertical transistors, transistors having polycrystalline channel portions, transistors formed above the transistor structure 300 in the z-direction, transistors supporting a channel in a z-direction, transistors or sets of transistors of a memory cell 105 formed with a cross section in the xy-plane that overlap or coincide with a cross section of one or more transistor structures 300 of the memory cell 105 in the xy-plane). In other examples, a memory cell 105 in accordance with the described techniques may omit transistors having the arrangement of the transistor structure 300, and may include transistors formed entirely from material portions deposited above or upon a substrate 320, which may include one or more layers or levels of transistors (e.g., along a height dimension). For example, referring to the circuit 201, at least some if not each of transistors 240-*a*, 245-*a*, 250-*a*, 255-*a*, 260-*a*, and 265-*a* may be formed in accordance with one or more techniques described herein for forming transistors above a substrate.

FIGS. 4A through 4F provide illustrations of a memory structure 400 that may support thin film random access memory in accordance with examples as disclosed herein. For illustrative purposes, aspects of the memory structure 400 may be described with reference to an x-direction, a y-direction, and a z-direction of a coordinate system 401 (e.g., as in FIGS. 4B through 4F). In some examples, the z-direction may be illustrative of a direction perpendicular to a surface of a substrate (e.g., a surface in an xy-plane, a surface upon or over which other materials may be deposited), and each of the related structures, illustrated in FIGS. 4B through 4F by their respective cross section in an xy-plane, may extend for some distance (e.g., a height, a dimension relative to a substrate) in the z-direction (e.g., a vertical direction). In some examples, the x-direction may be aligned with or referred to as a row direction (e.g., of a row of memory cells 105), and the y-direction may be aligned with or referred to as a column direction (e.g., of a column of memory cells).

The memory structure 400 may illustrate an example for implementing respective second portions 295 of an array of memory cells 105, which may be formed (e.g., formed entirely) from material portions deposited on or above a substrate, such as material portions formed above substrate 320 described with reference to FIG. 3. Although certain reference numbering is omitted from one or more of FIGS. 4A through 4F for illustrative clarity, features of the associated array of memory cells 105 are described with reference to rows that are each coupled with a respective word line 120 (e.g., WL0 through WL3), and columns that are each coupled with a respective pair of a bit line 130 and a bit line 135 (e.g., a first column associated with BL0 and BL0 #, a second column associated with BL1 and BL #), and each memory cell 105 may include transistors 260, 250, 255, and 265 (e.g., T1, T2, T3, and T4 transistors, respectively) coupled with nodes 230 and 235 (e.g., an A node and B node, respectively). Each of the features of FIGS. 4A through 4F may be examples of the respective features, or portions thereof, as described with reference to FIG. 1, 2A, or 2B. Each of the memory cells 105 may also be associated with a respective first portion 290, which is omitted from each of FIGS. 4A through 4F but may be included in various configurations to support functionality of the memory structure 400 in a memory array 110.

Figure 4A:
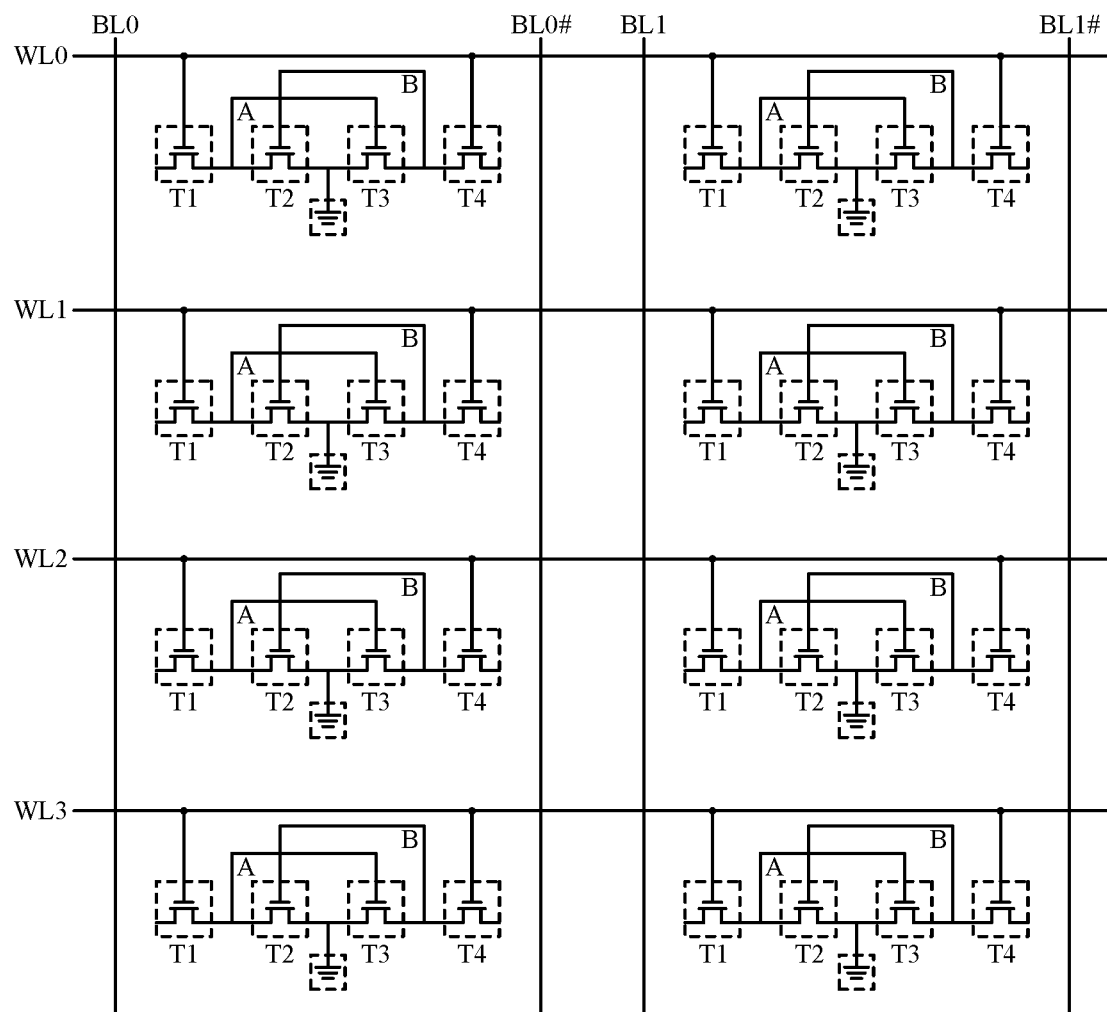

FIG. 4A shows a circuit schematic of the memory structure 400, including an example arrangement for four rows of memory cells 105 (e.g., each coupled with, accessible by, or otherwise associated with one of word lines WL0 through WL3) and two columns of memory cells 105 (e.g., each coupled with, accessible by, or otherwise associated with the pair of bit lines BL0 and BL0 # or the pair of bit lines BL1 and BL1 #). However, it is to be understood that the described techniques and structures may be applied to any quantity of one or more rows, or any quantity of one or more columns, or various combinations thereof.

Figure 4B:
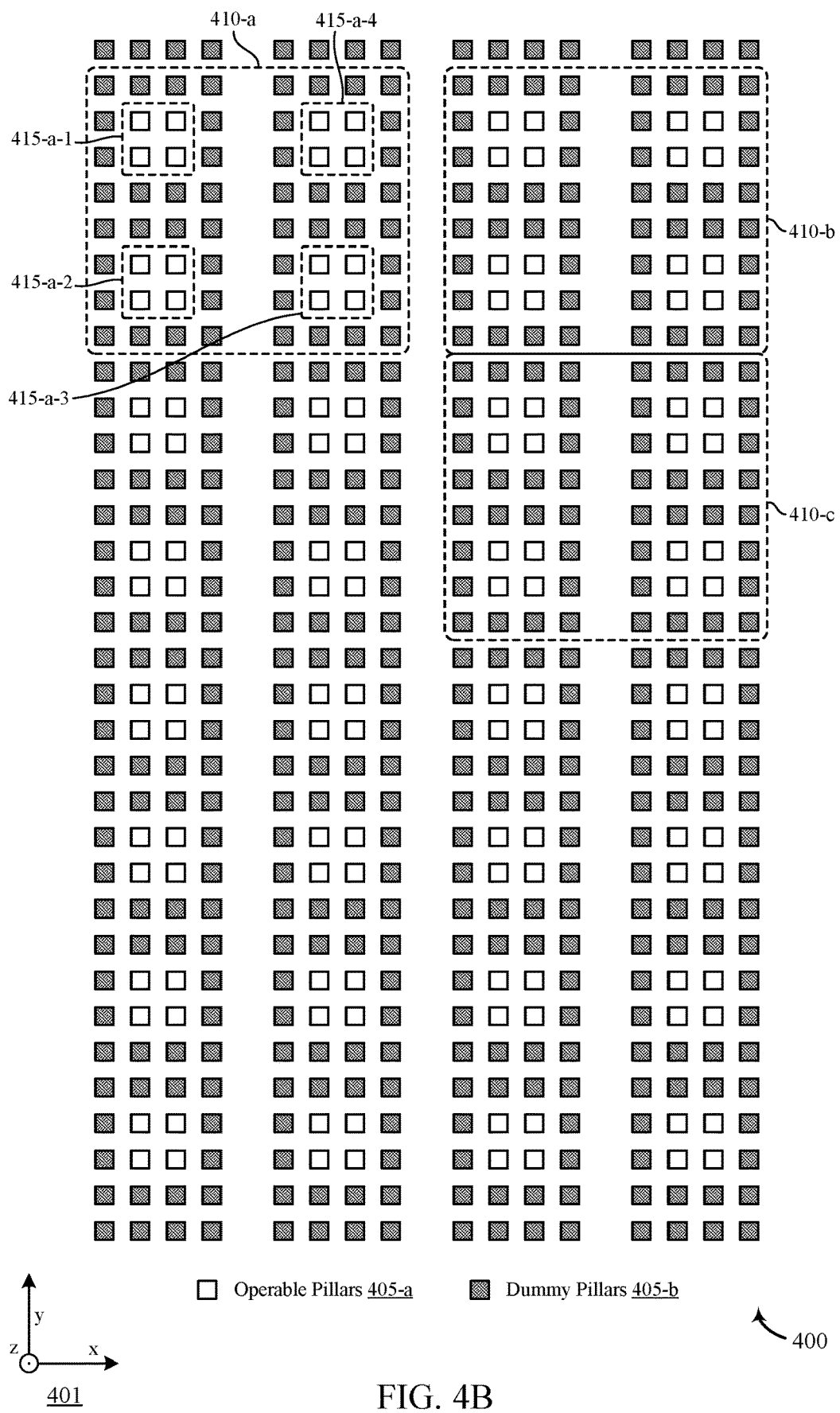

FIG. 4B shows an arrangement of pillars 405 of the memory structure 400 arranged in the x-direction (e.g., a row direction) and the y-direction (e.g., a column direction), where each of the pillars 405 may extend in the z-direction (e.g., according to a pillar height, which may be greater than the extent of pillars 405 in either or both of the x-direction or y-direction). In some examples, each of the pillars 405 may be referred to as a thin film transistor (TFT) pillar or other structure. Although the pillars 405 are illustrated with a square cross-section (e.g., in the xy-plane), pillars 405 may be formed with other cross-sectional shapes such as rectangles, circles, ovals, and other shapes.

The memory structure 400 includes operable pillars 405-a, each of which may be operable to support at least a portion of a channel of a transistor (e.g., a channel or operable conductive path aligned along the z-direction, supporting an electrical coupling or conductive path between source and drain terminals based at least in part on a voltage of a respective gate portion, gate terminal, or gate conductor). Each of the operable pillars 405-a may include one or more doped semiconductor portions. For example, to support an n-type transistor, an operable pillar 405-a may include at least a p-type semiconductor portion, or may include a stack (e.g., in the z-direction) of an n-type semiconductor, a p-type semiconductor, and an n-type semiconductor (e.g., in an NPN arrangement in the z-direction), among other constituent materials or arrangements. To support a p-type transistor, an operable pillar 405-a may include at least an n-type semiconductor portion, or may include a stack (e.g., in the z-direction) of an p-type semiconductor, an n-type semiconductor, and a p-type semiconductor (e.g., in an PNP arrangement in the z-direction), among other constituent materials or arrangements. In some examples, a pillar as described herein (e.g., a pillar 405) may include one or more electrodes or electrode portions, such as an electrode at one or both ends of the pillar (e.g., a top end, a bottom end, or both).

The memory structure 400 may also include dummy pillars 405-b (e.g., inoperable pillars), each of which may not be operable to support a transistor channel. For example, dummy pillars 405-b may be configured to not be activated by any gate portion, gate terminal, or gate conductor of the memory structure 400. In some examples, dummy pillars 405-b may be included to facilitate manufacturability, such as to leverage certain manufacturing techniques or configurations, or to provide material or processing uniformity across the distribution of pillars 405, among other reasons. In some examples, dummy pillars 405-b may be omitted from the memory structure 400, such that all of the pillars 405 of the memory structure 400 may be operable pillars 405-a.

Each of the pillars 405 may be associated with a height or a height dimension relative to the substrate (e.g., a lower extent in the z-direction, an upper extent in the z-direction, a span in the z-direction), which may be defined as part of balancing various performance criteria of the memory array. In some examples, a height dimension or extent in the z-direction of dummy pillars 405-b may be the same as or at least partially overlapping with a height dimension or extent in the z-direction of operable pillars 405-a. For example, each of the operable pillars 405-a and each of the dummy pillars 405-b may have a common height dimension (e.g., a common upper extent, a common lower extent, or both) relative to the substrate. In some examples, one or more of the pillars 405 (e.g., one or more of the operable pillars 405-a, one or more of the dummy pillars 405-b) may have a height or a height dimension that is different than others of the pillars 405 (e.g., different than others of the operable pillars 405-a, different than others of the dummy pillars 405-b)

The pillars 405 may be formed according to various techniques. In some examples, one or more layers or stacks of layers of doped semiconductor material may be deposited on or above a substrate, and portions of the deposited layers located between respective pillars 405 (e.g., along the x-direction, along the y-direction) may be etched away or trenched to form pillars 405, in which case operable pillars 405-a and dummy pillars 405-b may be formed from the same material or combination of materials (e.g., from a same layer or stack of layers). In some examples, such layers may include one or more electrode layers, such as an electrode layer above a stack of doped semiconductor material layers, an electrode layer below a stack of doped semiconductor material layers, or both, and such electrode layers may be or may not be etched or trenched along with the pillar formation processes. Additionally or alternatively, in some examples, holes or trenches may be etched through a material (e.g., in the z-direction, through a dielectric material, through a gate dielectric material) and material for the pillars 405 (e.g., one or more doped semiconductor materials, one or more electrode materials) may be deposited in the etched holes or trenches. In examples where pillar material is deposited into holes, trenches, or other recesses, operable pillars 405-a and dummy pillars 405-b may or may not be formed from a same material or combination of materials.

The pillars 405 may be grouped or configured according to various sets corresponding to respective memory cells 105 or components thereof. For example, a set 410 may include a set of pillars 405 corresponding to a memory cell 105 (e.g., set 410-a corresponding to a memory cell 105 of a first row and first column of the memory structure 400, a set 410-b corresponding to a memory cell 105 of the first row and a second column, a set 410-c corresponding to a memory cell 105 of a second row and the second column). In various examples, a set 410 may or may not include or refer to dummy pillars 405-b within an illustrative boundary of the set 410. In some examples, a set 410 may correspond to a set or quantity of pillars (e.g., operable pillars 405-a) that support storing one bit of information, or more than one bit of information (e.g., in a multi-level cell).

A set 410, or an associated memory cell 105, may be associated with a cross-sectional area (e.g., a span or extent in the x-direction and y-direction, a span or extent in an xy-plane) or pitch (e.g., distance of repetition along the x-direction, distance of repetition along the y-direction). In examples where the memory structure 400 is coupled with respective first portions 290 for each of the associated memory cells 105 (e.g., where the memory structure 400 is built upon or over a substrate 320 including at least a portion of the first portion 290, such as T5 and T6 transistors), the respective first portion 290 of each memory cell 105 may have a same or overlapping cross section (e.g., in the xy-plane, as viewed along the z-direction) as a cross section of the set 410 for the memory cell 105. In some examples, the pitch (e.g., in the x-direction, in the y-direction, or both) of the first portions 290 (e.g., built upon or otherwise associated with a substrate 320) may be the same as the pitch of the sets 410.

In some examples, each of a plurality of sets 415 corresponding to a memory cell 105 (e.g., as respective subsets of a set 410) may be associated with a respective transistor of the memory cell 105. For example, a set 415-*a*-1 may correspond to a first transistor of a memory cell 105 (e.g., a T1 transistor, a transistor 260), a set 415-*a*-2 may correspond to a second transistor of the memory cell 105 (e.g., a T2 transistor, a transistor 250), a set 415-*a*-3 may correspond to a third transistor of the memory cell 105 (e.g., a T3 transistor, a transistor 255), and a set 415-*a*-4 may correspond to a fourth transistor of the memory cell 105 (e.g., a T4 transistor, a transistor 265). Each operable pillar 405-*a* of a set 415 may form at least a portion of a channel of the corresponding transistor.

A set 415 may include any quantity of one or more pillars 405 (e.g., one or more operable pillars 405-*a*), and different transistors of a memory cell 105 may include same or different quantities or arrangements of pillars. In the example of memory structure 400, each set 415 includes four pillars 405 arranged in a two-by-two pattern. However, a set 415 may include different arrangements of pillars 405 (e.g., in the x-direction and y-direction, such as a four-by-one arrangement, a one-by-four arrangement), or different quantities of pillars (e.g., one pillar, two pillars, eight pillars, and others). In some examples, transistors of a memory cell 105 having a same, symmetric, or otherwise related electrical characteristic or configuration may have similarly configured sets 415. For example, sets 415-*a*-1 and 415-*a*-4, corresponding to T1 and T4 transistors (e.g., configured or operable as cell selection components), may have a common quantity or configuration of operable pillars 405-*a*. Further, sets 415-*a*-2 and 415-*a*-3, corresponding to T2 and T3 transistors (e.g., configured as or operable as a cross-coupled pair of transistors), may have a common quantity or configuration of operable pillars 405-*a*, which may be the same as or different than a quantity of operable pillars 405-*a* of the sets 415-*a*-1 and 415-*a*-4.

In some examples, a quantity or configuration of pillars 405 (e.g., operable pillars 405-*a*) may be defined or chosen for particular characteristics, such as an associated drive strength (e.g., drive current), impedance, activation threshold, or leakage characteristic of a particular transistor or set of transistors. In some examples, multiple operable pillars 405-*a* of a set 415 may be described as or configured as parallel physical structures (e.g., parallel channels) of a common transistor or transistor component of a memory cell 105 (e.g., corresponding to the respective set 415). In some examples, each operable pillar 405-*a* of a set 415 may be described as or configured as a component of single transistor, such that a corresponding memory cell 105 may be described as or configured as having multiple transistors in a parallel arrangement (e.g., having multiple T1 transistors in an electrically parallel arrangement that are each associated with a single operable pillar 405-*a*, having multiple T2 transistors in an electrically parallel arrangement that are each associated with a single operable pillar 405-*a*, and so on).

FIG. 4C shows an example for interconnection of operable pillars 405-*a* of the memory structure 400. For example, the memory structure 400 includes conductors 420-*a* that may provide an interconnection (e.g., in the y-direction, along a column direction) between the operable pillars 405-*a* of T1 transistors and operable pillars 405-*a* of T2 transistors of each memory cell 105, and conductors 420-*b* that may provide an interconnection between the operable pillars 405-*a* of T3 transistors and operable pillars 405-*a* of T4 transistors of each memory cell 105. In some examples, a conductor 420-*a* may provide a material for at least a portion of a node 230 (e.g., an A node) or coupling thereto, and a conductor 420-*b* may provide a material for at least a portion of a node 235 (e.g., a B node) or coupling thereto. In some examples, conductors 420 may be formed below and in contact with (e.g., in electrical contact with, in physical contact with) pillars 405 (e.g., nearer to a substrate), and may be formed from a metal or metal alloy (e.g., copper, tungsten, gold, silver, tin, aluminum, or alloys thereof).

FIG. 4C also illustrates examples of an arrangement or a pattern of respective transistors for each of the memory cells 105. For example, along a row of memory cells 105 (e.g., in the x-direction), a transistor arrangement may have a standard repetition (e.g., [T1,T4], [T1,T4], and so on, [T2,T3], [T2,T3], and so on, according to a pitch of memory cells 105 along the x-direction), whereas along a column of memory cells 105 (e.g., along the y-direction), a transistor arrangement may have a mirrored or swapped repetition (e.g., [T1,T2], [T2,T1], [T1,T2], [T2,T1], and so on, [T4,T3], [T3,T4], [T4,T3], [T3,T4], and so on, according to a pitch of memory cells 105 along the y-direction), which may facilitate certain wiring or interconnection schemes of the memory structure 400.

Figure 4D:
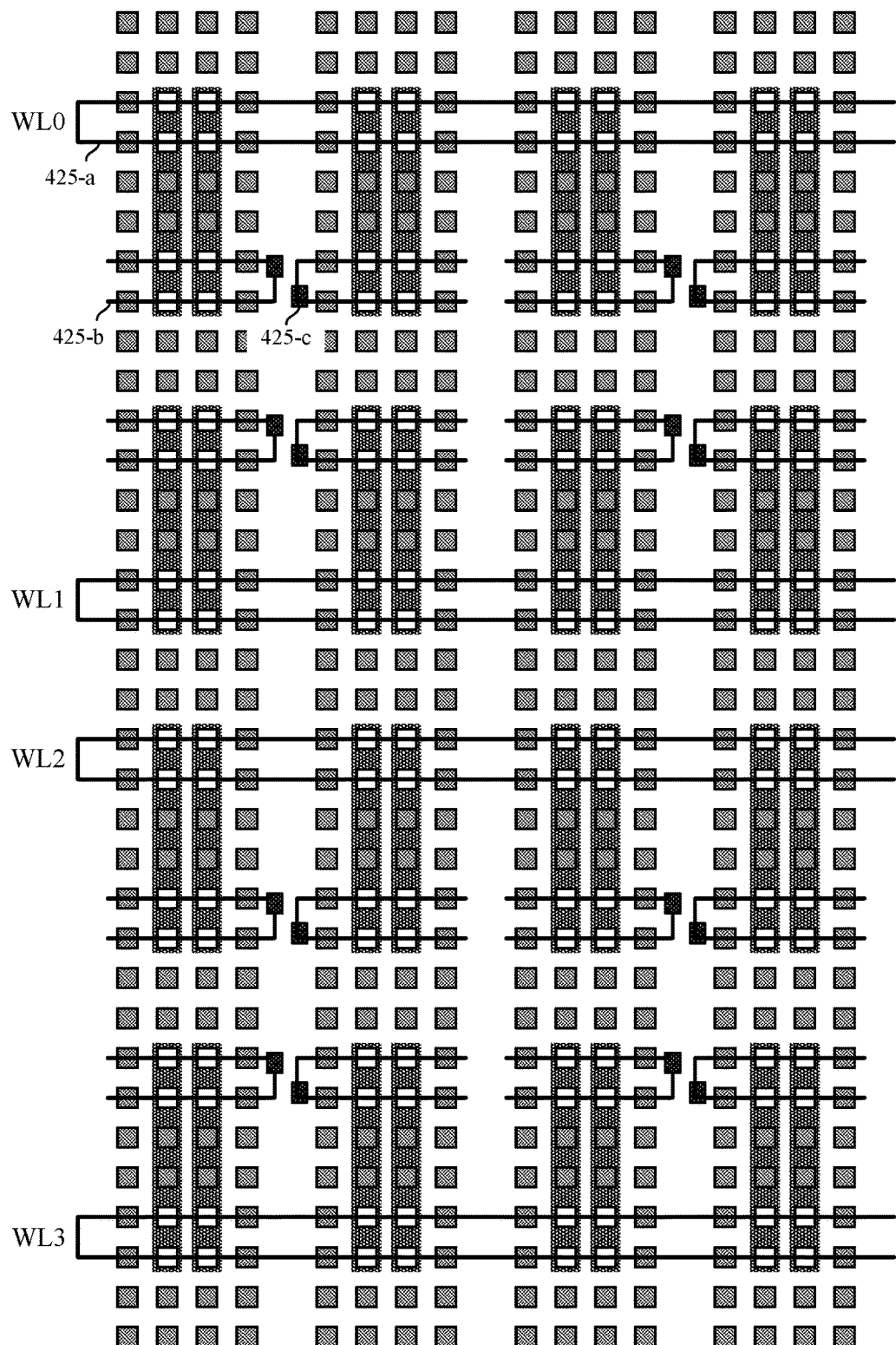

FIG. 4D shows an example for associating operable pillars 405-*a* of the memory structure 400 with conductors 425, at least a portion of which may be associated with (e.g., refer to, be illustrative of, be operable as) gates or gate terminals of one or more of the operable pillars 405-*a*. For example, conductors 425 may be configured to activate or deactivate a channel (e.g., a vertical channel, a vertical conductive path, a channel along the z-direction) of one or more operable pillars 405-*a* (e.g., one or more transistors), or may be configured to control a conductive path of one or more operable pillars 405-*a* (e.g., based at least in part on a voltage of the conductor 425), among other terminology or functionality.

The memory structure 400 may include conductors 425-*a*, which may be an example of, may be included as at least a part of, or may be otherwise coupled with a word line 120 (e.g., one of word lines WL through WL3). For example, conductors 425-*a* may be coupled with a row controller for selecting or activating a row of memory cells 105. Conductors 425-*a* may be coupled with or operable as at least a portion of respective gates, gate portions, or gate terminals for T1 and T4 transistors (e.g., cell selection components).

The memory structure 400 may include conductors 425-*b*, which may be coupled with or operable as at least a portion of respective gates, gate portions, or gate terminals for T2 transistors, and conductors 425-*c*, which may be coupled with or operable as at least a portion of respective gates, gate portions, or gate terminals for T3 transistors. In some examples, a conductor 425-*b* may provide a material for at least a portion of a node 235 (e.g., a B node) or coupling thereto. In some examples, conductors 425-*b* may include an accessible pad (e.g., between columns of pillars 405, accessible along the z-direction), which may support an interconnection with a corresponding conductor 420-*b* (e.g., of a different layer or level of the memory structure 400, through one or more vias along the z-direction) or one or more substrate-based transistors (e.g., of respective first portions 290), or a combination thereof. In some examples, a conductor 425-*c* may provide a material for at least a portion of a node 230 (e.g., an A node) or coupling thereto. In some examples, conductors 425-*c* may include an accessible pad (e.g., between columns of pillars 405, accessible along the z-direction), which may support an interconnection with a corresponding conductor 420-*a* (e.g., of a different layer or level of the memory structure 400, through one or more vias along the z-direction), or one or more substrate-based transistors (e.g., of respective first portions 290), or a combination thereof.

Although the conductors 425 are shown above the pillars 405 for illustrative and associative purposes, the conductors 425 may be configured as, or may be coupled with, conductors located alongside operable pillars 405-*a* for activating the corresponding channel portions, among other alternative examples. For example, the conductors 425 may be coupled with or may include metal conductors having extents (e.g., a height dimension) in the z-direction that are within or at least partially overlap with the extents of operable pillars 405-*a* in the z-direction. Such metal conductors may be separated from an operable pillars 405-*a* (in the x-direction, in the y-direction, in the x-direction and y-direction, in a radial direction) by a gate dielectric that is in contact with portions of the conductor 425 and the operable pillar 405-*a*. In some examples, conductors 425 may be located alongside the pillars 405 (e.g., as a transverse gate, as a pass-by gate, as a pair of gate conductors on either side of a pillar 405), including conductors extending between the pillars 405 along the x-direction and separated from operable pillars 405-*a* in the y-direction by a gate dielectric. In some examples, conductors 425 may include at least a portion that wraps (e.g., partially, entirely) around operable pillars 405-*a* (e.g., as a wrap-around gate, as a circumferential gate, as an all-around gate), where at least the operable pillars 405-*a* may be wrapped (e.g., partially wrapped, entirely wrapped) with a circumferential gate dielectric that is in contact with the pillar 405-*a* and the conductor 425. The conductors 425 may be formed from a metal or metal alloy (e.g., copper, tungsten, gold, silver, tin, aluminum, or alloys thereof).

Figure 4E:
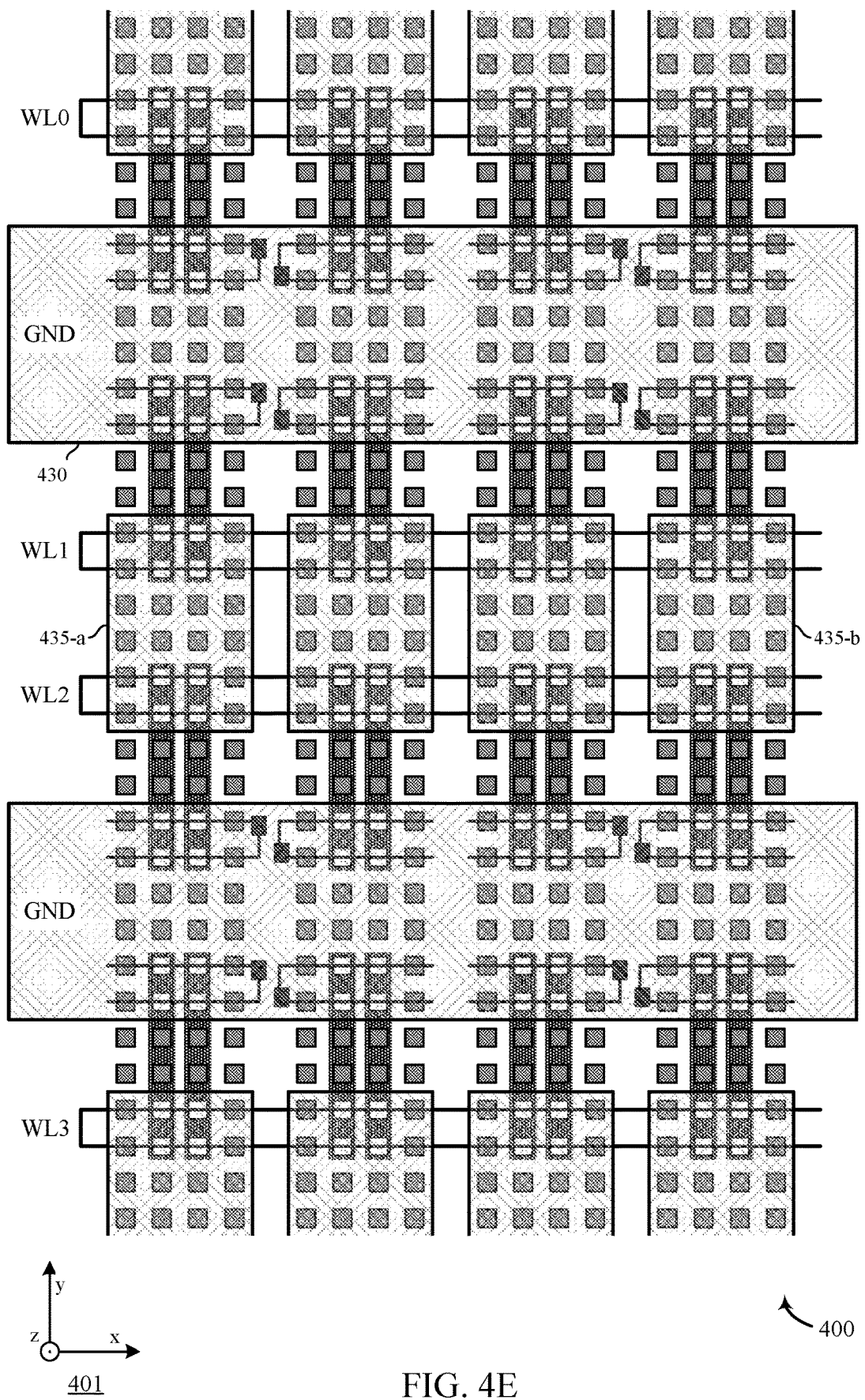

FIG. 4E shows further examples for interconnection of operable pillars 405-*a* of the memory structure 400. For example, the memory structure 400 may include conductors 430, which may provide an interconnection of operable pillars 405-*a* of some sets 415 (e.g., sets 415 corresponding to T2 and T3 transistors) with a voltage source (e.g., a ground (GND) voltage source, a voltage source 280). In some examples, conductors 430 may be formed above and in contact with (e.g., in electrical contact with, in physical contact with) pillars 405 (e.g., on an opposite end of pillars 405, in the z-direction, from conductors 420 and 425). In some examples, a conductor 430 or some portion thereof may be an example of a node 285 (e.g., a ground voltage supply node) of one or more memory cells 105.

Further, the memory structure 400 may include conductors 435 that may provide an interconnection of operable pillars 405-*a* of some sets 415 (e.g., sets 415 corresponding to T2 and T3 transistors) with bit lines. In some examples, conductors 435-*a* may provide a common coupling with a bit line 130 for T1 transistors that are neighboring or adjacent along the y-direction. In some examples, a conductor 435-*a* or some portion thereof may be an example of an access node 220-*a* as described with reference to FIG. 2A. In some examples, conductors 435-*b* may provide a common coupling with a bit line 135 for T4 transistors that are neighboring or adjacent along the y-direction. In some examples, a conductor 435-*b* or some portion thereof may be an example of an access node 225-*a* as described with reference to FIG. 2A. In some examples, conductors 435 may be formed above and in contact with (e.g., in electrical contact with, in physical contact with) pillars 405 (e.g., on an opposite end of pillars 405, in the z-direction, from conductors 420 or 425).

The conductors 430 and 435 may be formed from a metal or metal alloy (e.g., copper, tungsten, gold, silver, tin, aluminum, or alloys thereof). In some examples, conductors 430 and 435 may be formed on a common layer or level of a memory die, such as when a layer of conductive material is deposited over a surface of a memory die and etched to isolate respective conductors 430 and 435 from the deposited conductive material, or when areas between the conductors 430 and 435 are masked, and conductive material is deposited between the masking to form the respective conductors 430 and 450. In other examples, conductors 430 and 435 may be formed on different layers or levels of a memory die (e.g., when pillars 405 of different transistors are associated with different height dimensions).

Figure 4F:
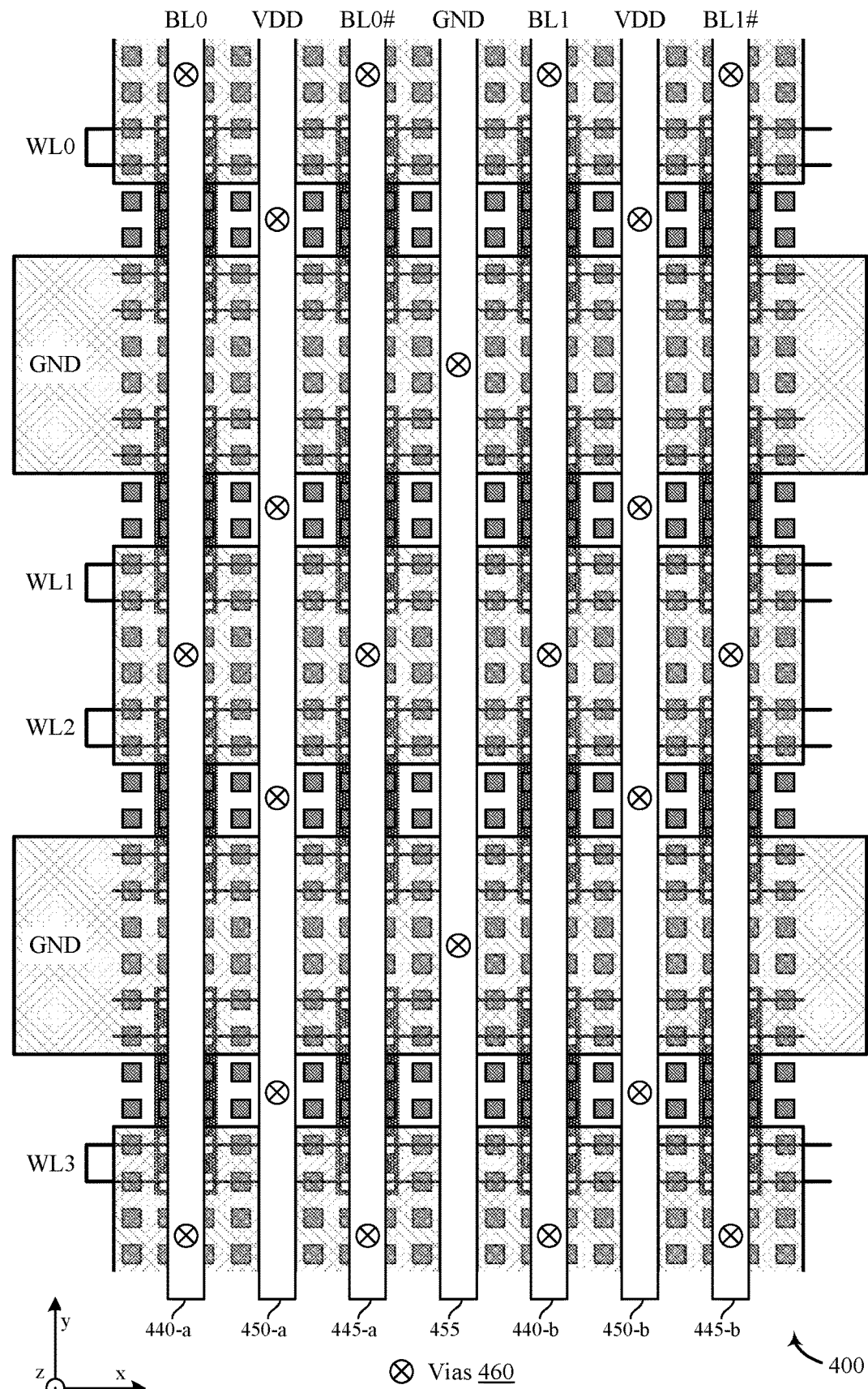

FIG. 4F shows further examples of interconnection for the memory structure 400. For example, the memory structure 400 may include bit line conductors 440, which may be a portion of or otherwise correspond to a bit line 130, and bit line conductors 445, which may be a portion of or otherwise correspond to a bit line 135. Further, the memory structure 400 may include voltage source conductors 450, which may be coupled with a voltage source 270 (e.g., a drain voltage), and voltage source conductors 455, which may be coupled with a voltage source 280 (e.g., a ground voltage, a source voltage).

The conductors 440, 445, 450, and 455 may be formed from a metal or metal alloy (e.g., copper, tungsten, gold, silver, tin, aluminum, or alloys thereof), and be located above conductors 430 and 435 (e.g., as separated by an intervening dielectric layer). In some examples, conductors 440, 445, 450, and 455 may be formed on a common layer or level of a memory die, such as when a layer of conductive material is deposited over a surface of a memory die and etched to isolate respective conductors 440, 445, 450, and 455 from the deposited conductive material, or when areas between the conductors 440, 445, 450, and 455 are masked, and conductive material is deposited between the masking to form the respective conductors 440, 445, 450, and 455. In other examples, conductors 440, 445, 450, and 455 may be formed on different layers or levels of a memory die.

The conductors 440, 445, 450, and 455 may be interconnected with portions of the memory structure 400 that are below the respective conductor (e.g., lower in the z-direction) by one or more vias 460. For example, vias 460 may be used to interconnect bit line conductors 440 with conductors 435-*a*, to interconnect bit line conductors 445 with conductors 435-*b*, to interconnect voltage source conductors 450 with a drain voltage interconnection (e.g., of a substrate 320, below the memory structure 400, an interconnection with a voltage source 270), to interconnect voltage source conductors 455 with conductors 430, or various combinations thereof. In some examples, a via 460 interconnecting a voltage source conductor 450 with a first portion 290 of a memory cell 105 or some portion thereof may be an example of a node 275.

FIGS. 5A through 5E provide illustrations of a memory structure 500 that may support thin film random access memory in accordance with examples as disclosed herein. For illustrative purposes, aspects of the memory structure 500 may be described with reference to an x-direction, a y-direction, and a z-direction of a coordinate system 501 (e.g., as in FIGS. 4B through 4F). In some examples, the z-direction may be illustrative of a direction perpendicular to a surface of a substrate (e.g., a surface in an xy-plane, a surface upon or over which other materials may be deposited). In some examples, the x-direction may be aligned with or referred to as a row direction (e.g., of a row of memory cells 105), and the y-direction may be aligned with or referred to as a column direction (e.g., of a column of memory cells).

In some examples, the memory structure 500 may include or be an example of one or more aspects of the memory structure 400 described with reference to FIGS. 4A through 4F (e.g., a second portion 295 of a memory cell 105). For example, the memory structure 500 may illustrate examples or aspects of structures associated with one of the memory cells 105 (e.g., a single memory cell 105) described reference to FIGS. 4A through 4F, which may be formed over a substrate 320 or over a first portion 290 of the memory cell 105 (not shown). The memory structure 500 illustrates physical spacing or separation between certain components intended to be electrically isolated, but such spaces or separation may include or be occupied by one or more materials, such as a dielectric material, that have been omitted for illustrative clarity.

Figure 5A:
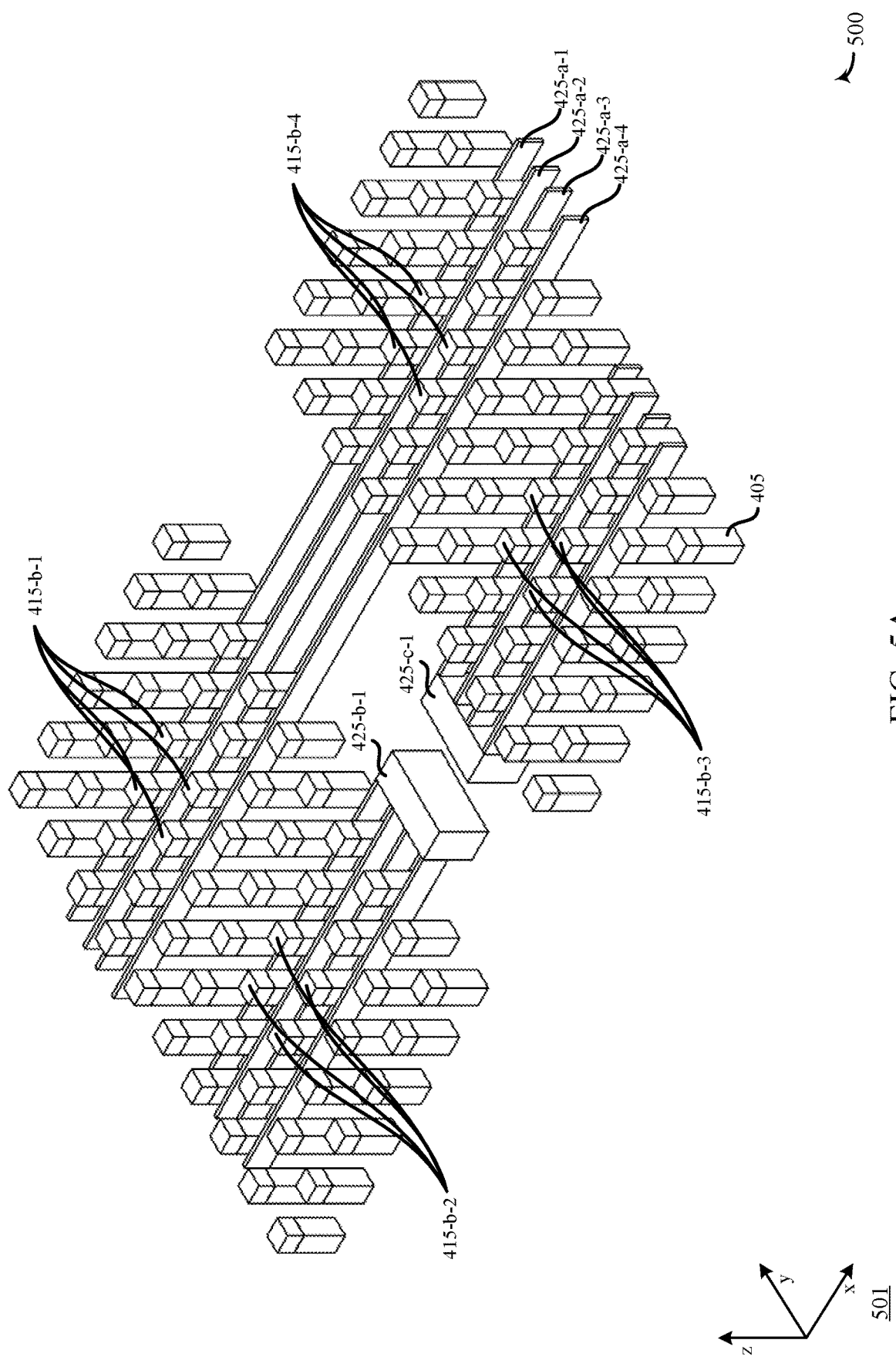
FIGS. 5A through 5E provide illustrations of a memory structure that may support thin film random access memory in accordance with examples as disclosed herein.
Figure 5B:
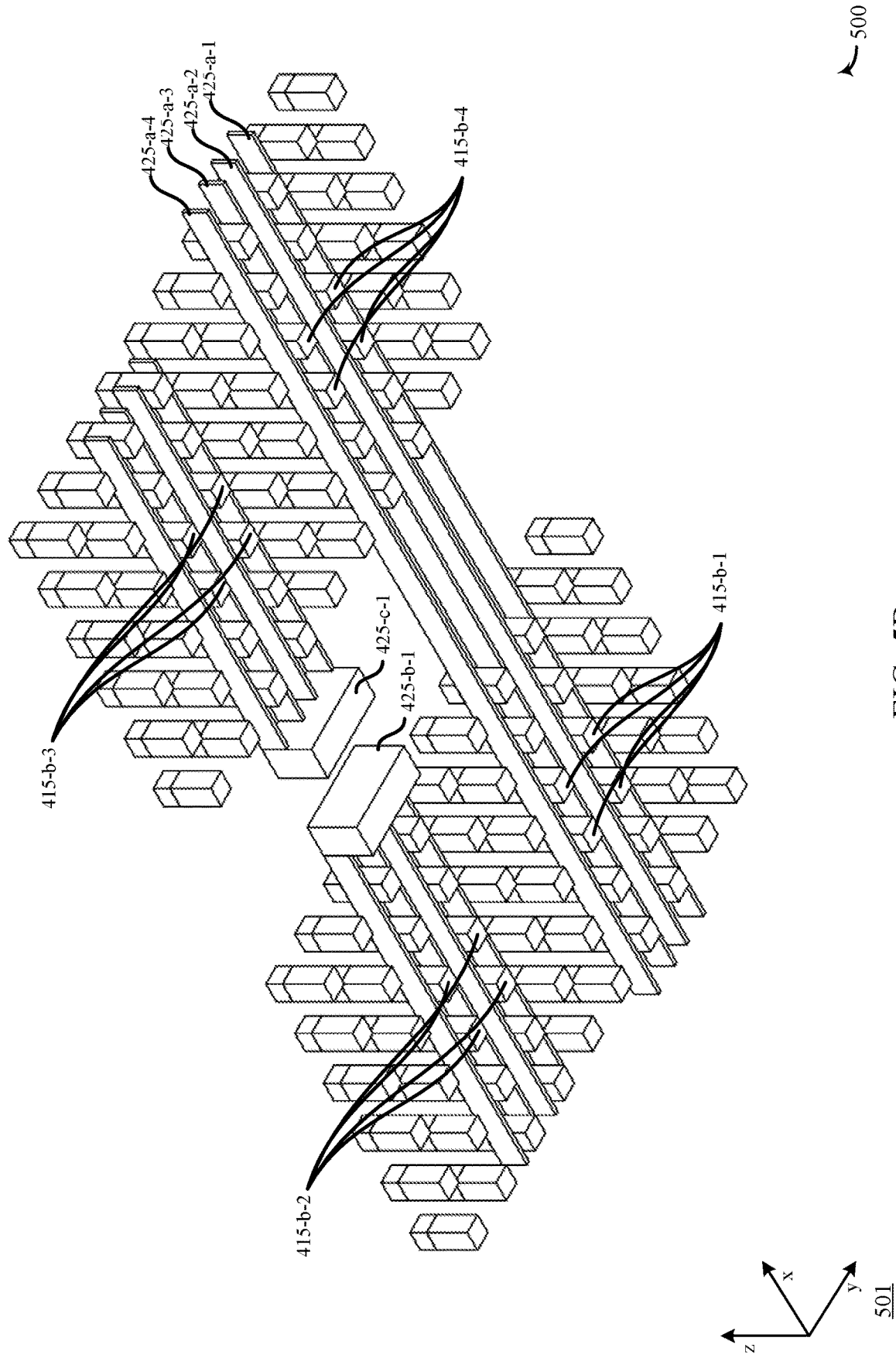

FIGS. 5A and 5B provide a top and bottom isometric view, respectively, of the memory structure 500. Each of the views illustrates an array of pillars 405 that may be included in a set 410 for the memory cell 105 of the memory structure 500. As identified in FIGS. 5A and 5B, the memory structure includes operable pillars 405-*a* of a set 415-*b*-1 (e.g., of a T1 transistor), a set 415-*b*-2 (e.g., of a T2 transistor), a set 415-*b*-3 (e.g., of a T3 transistor), and a set 415-*b*-4 (e.g., of a T4 transistor). Other pillars 405 of the memory structure 500 may be dummy pillars.

As further identified in FIGS. 5A and 5B, the memory structure 500 may include various conductors 425 configured to activate channel portions (e.g., vertical channels) of the operable pillars 405-*a*, which may be examples of the conductors 425 described with reference to FIG. 4D. For example, the memory structure 500 includes conductors 425-*a*-1 through 425-*a*-4, which may be a portion of, or otherwise coupled with a word line 120 for activating or selecting the memory cell 105, and may be operable to activate channel portions of the pillars 405 of sets 415-*b*-1 and 415-*b*-4. The memory structure 500 also includes conductor 425-*b*-1, which may be operable to activate channel portions of the pillars 405 of set 415-*b*-2, and conductor 425-*c*-1, which may be operable to activate channel portions of the pillars 405 of set 415-*b*-3. Each of the conductors 425-*a*-1 through 425-*a*-1, 425-*b*-1, and 425-*c*-1, or portions thereof, may be an example of a transverse or pass-by gate conductor (e.g., passing by or between pillars 405 and extending along the x-direction), and may have a height dimension (e.g., extent in the z-direction) that is within or otherwise overlapping with the height dimension of the pillars 405.

Figure 5C:
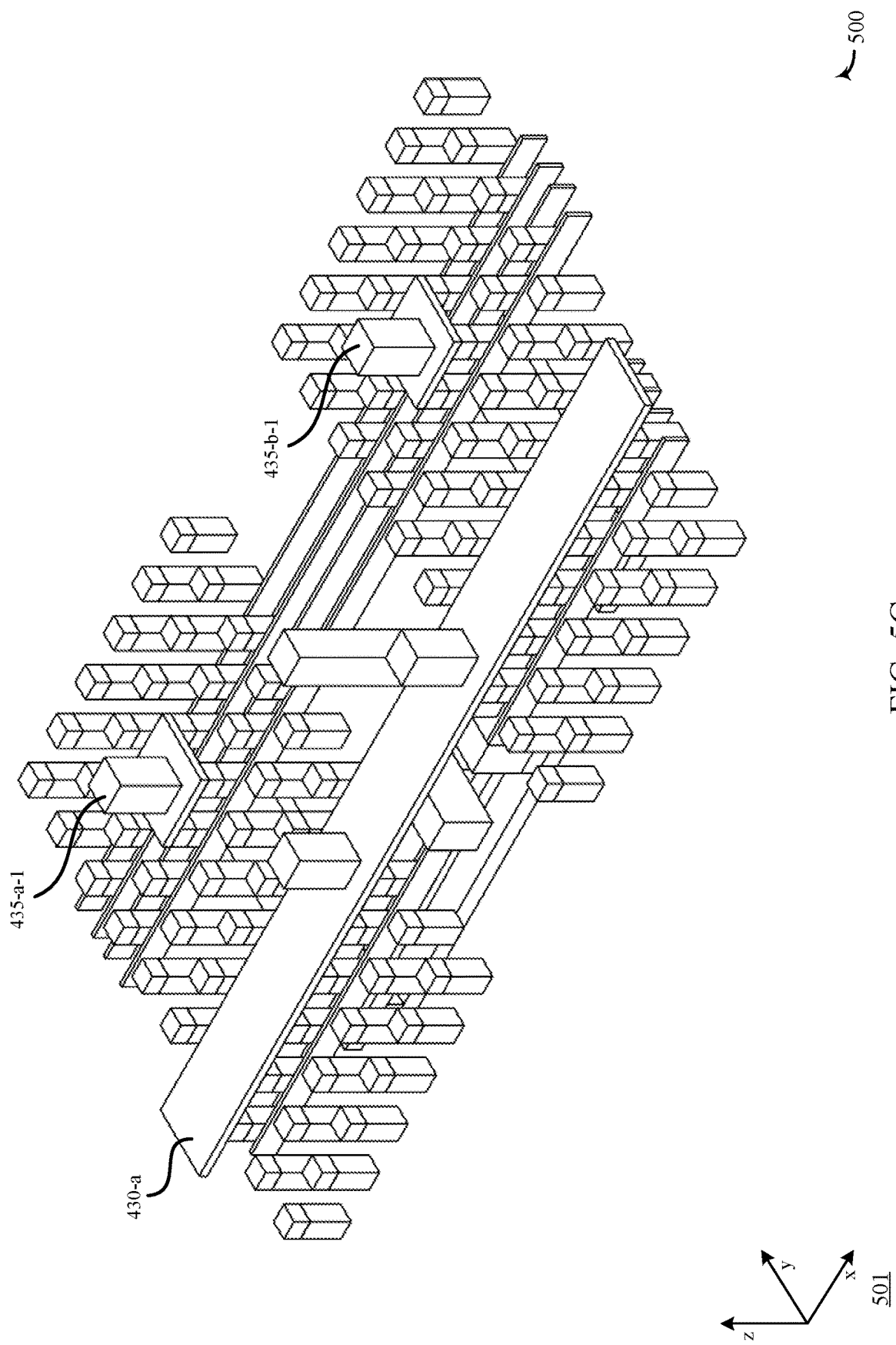
Figure 5D:
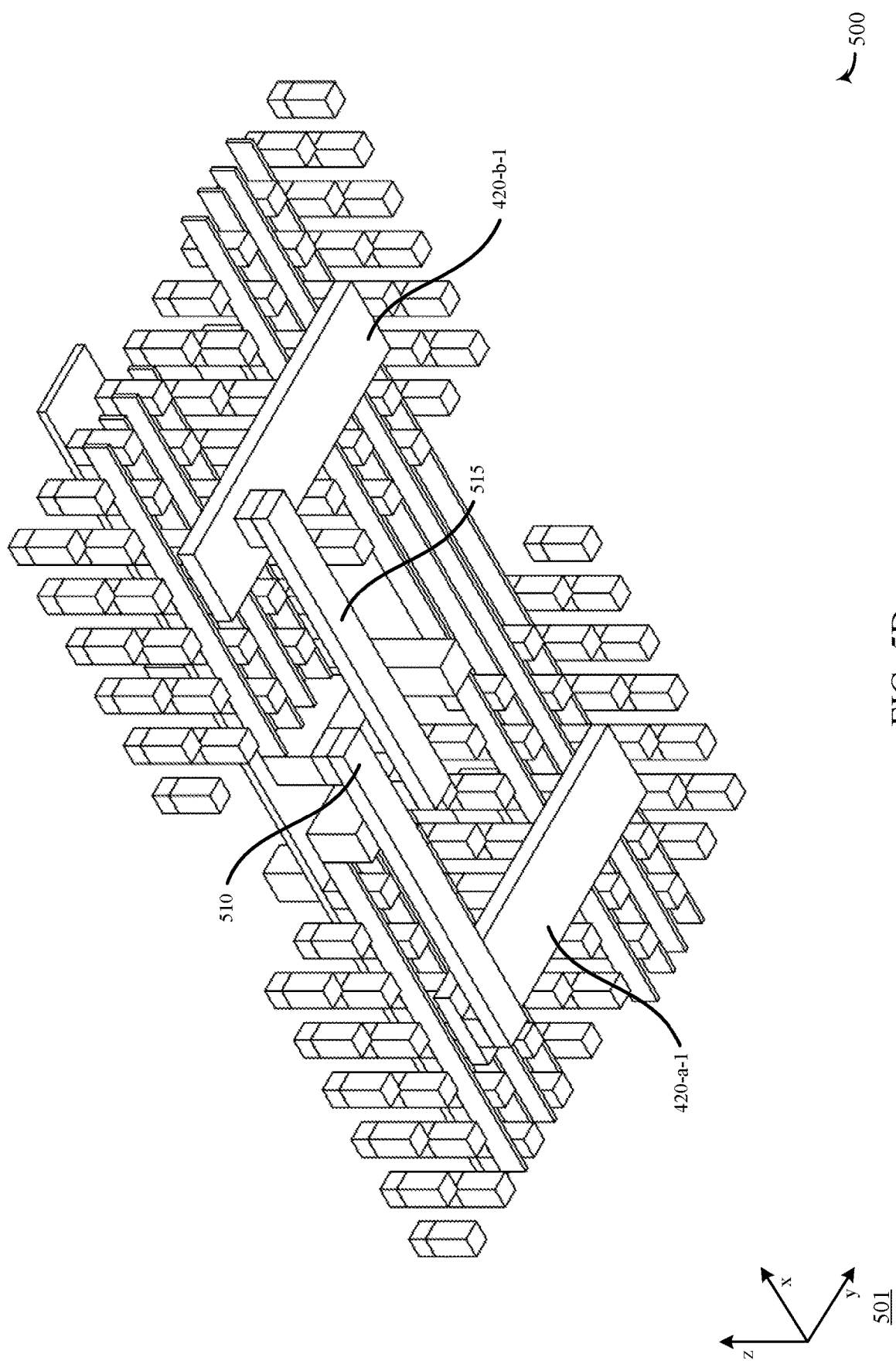

FIGS. 5C and 5D provide a top and bottom isometric view, respectively, of the memory structure 500. The views of FIGS. 5C and 5D illustrate examples for the addition of a conductor 430-*a* (e.g., an example of a node 285, a ground node, a source node), a conductor 435-*a*-1 (e.g., an example of an access node 220), a conductor 435-*b*-1 (e.g., an example of an access node 225), a conductor 420-*a*-1, and a conductor 420-*b*-1. The views also show an interconnection 510 between the conductor 420-*a*-1 and the conductor 425-*c*-1, where the interconnection 510, the conductor 420-*a*-1, or the conductor 425-*c*-1, or a portion thereof or a combination thereof, may be an example of a node 230. The views also show an interconnection 515 between the conductor 420-*b*-1 and the conductor 425-*b*-1, where the interconnection 515, the conductor 420-*b*-1, or the conductor 425-*b*-1, or a portion thereof or a combination thereof, may be an example of a node 235.

Figure 5E:
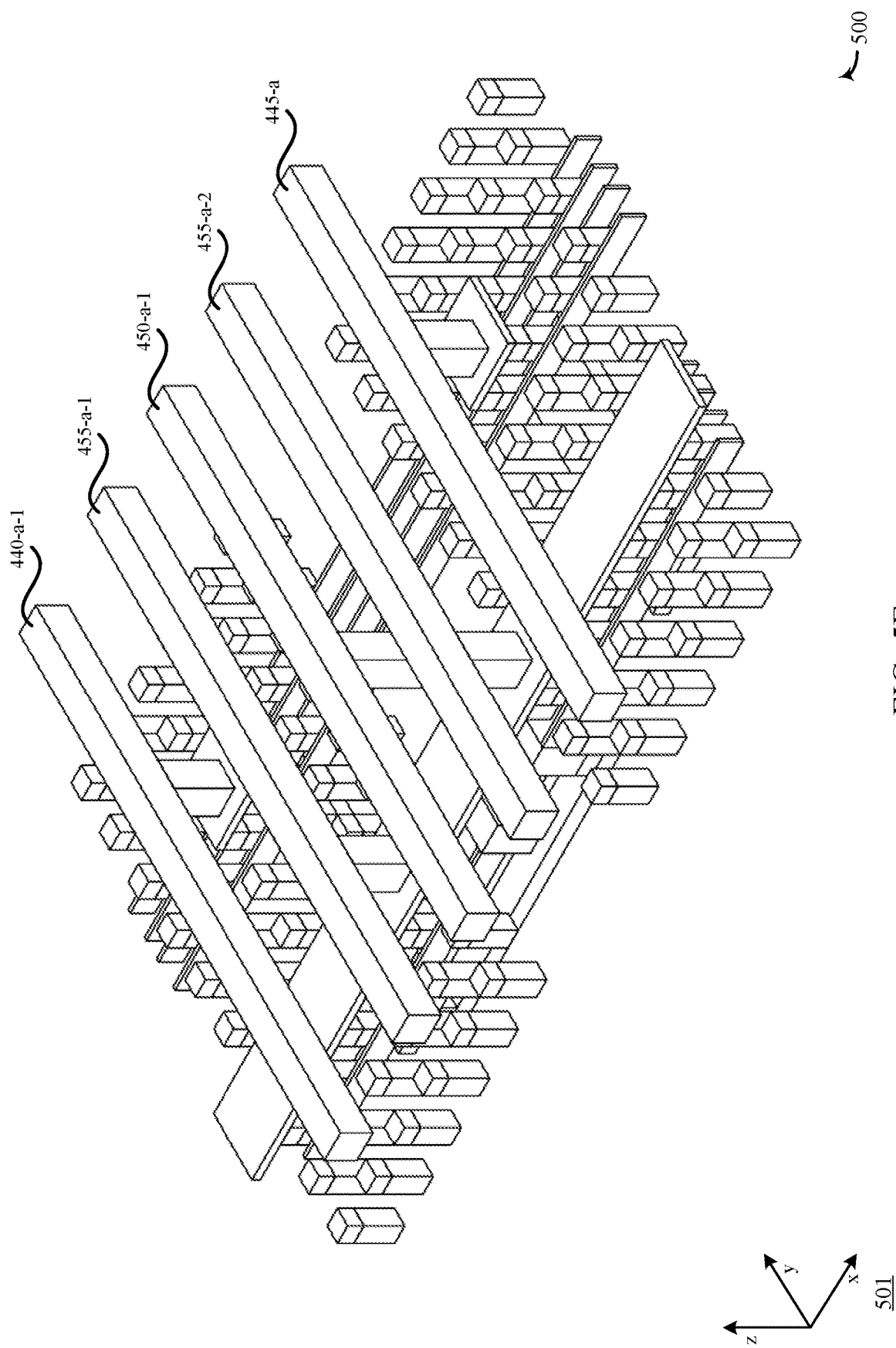

FIG. 5E provides a top isometric view of the memory structure 500. The view of FIG. 5E illustrate examples for the addition of a conductor 440-*a*-1 (e.g., a bit line 130, coupled with the conductor 435-*a*-1), conductors 455-*a*-1 and 455-*a*-2 (e.g., ground voltage source conductors, coupled with the conductor 430-*a*), a conductor 450-*a*-1 (e.g., a drain voltage source conductor, which may be coupled with one or more substrate-based transistors, such as those of a first portion 290), and a conductor 445-*a* (e.g., a bit line 135, coupled with the conductor 435-*b*-1).

Although the example of memory structure 500 illustrates an example of structures that may support a memory cell 105 including thin film structures such as vertical transistors (e.g., in a single level or layer of vertical transistors along the z-direction), the techniques described herein may be supported by various other configurations, such as different quantities of the described features (e.g., different quantities of pillars 405, different quantities of conductors), different arrangements of the described features (e.g., different patterns or arrangements of pillars, pillars having different constituent materials, different interconnection techniques, different routing techniques), or different characteristics of the described features (e.g., different shapes, different relative dimensions), or various combinations thereof.

Figure 6A:
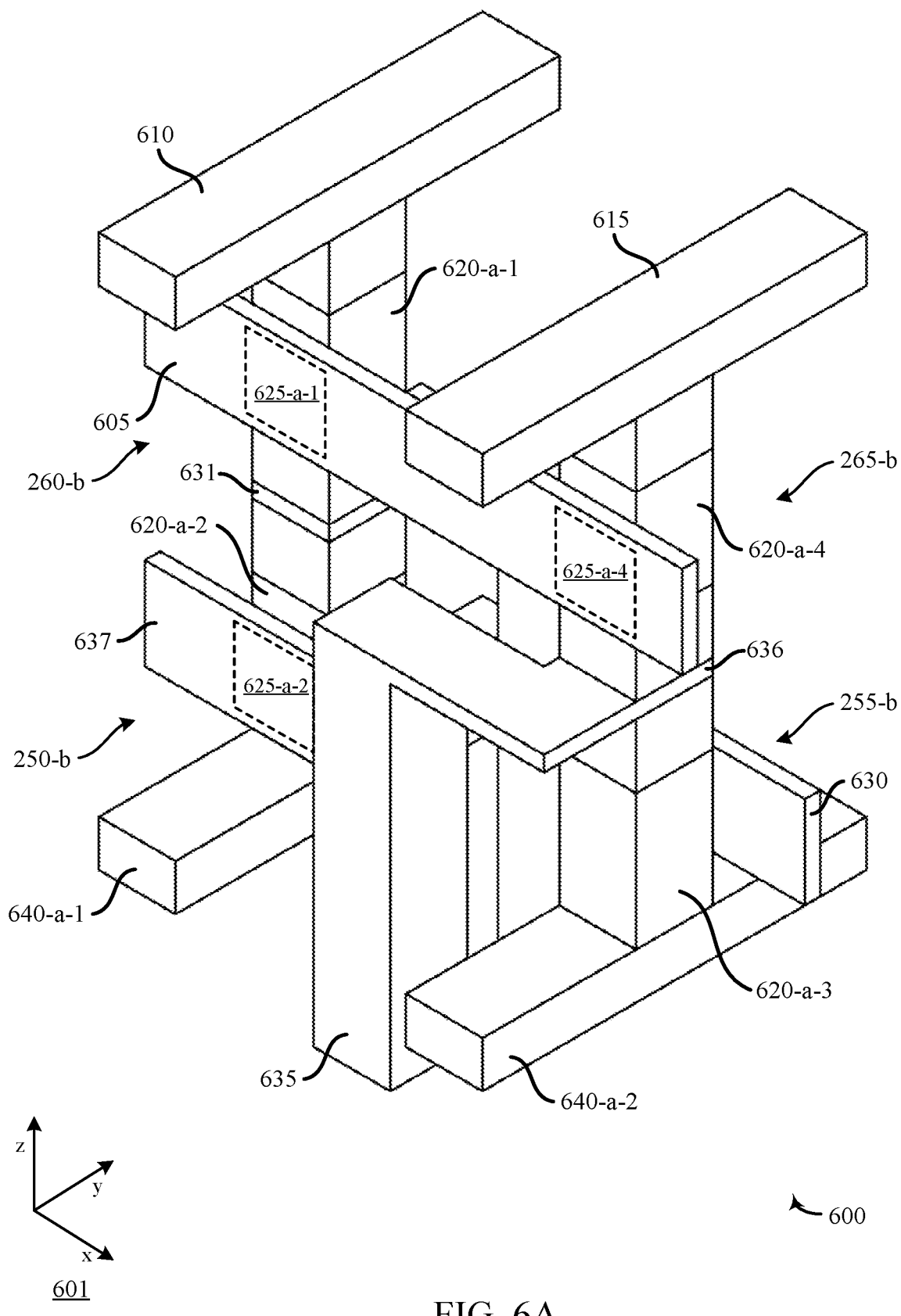
FIGS. 6A and 6B provide illustrations of a memory structure that may support thin film random access memory in accordance with examples as disclosed herein.
Figure 6B:
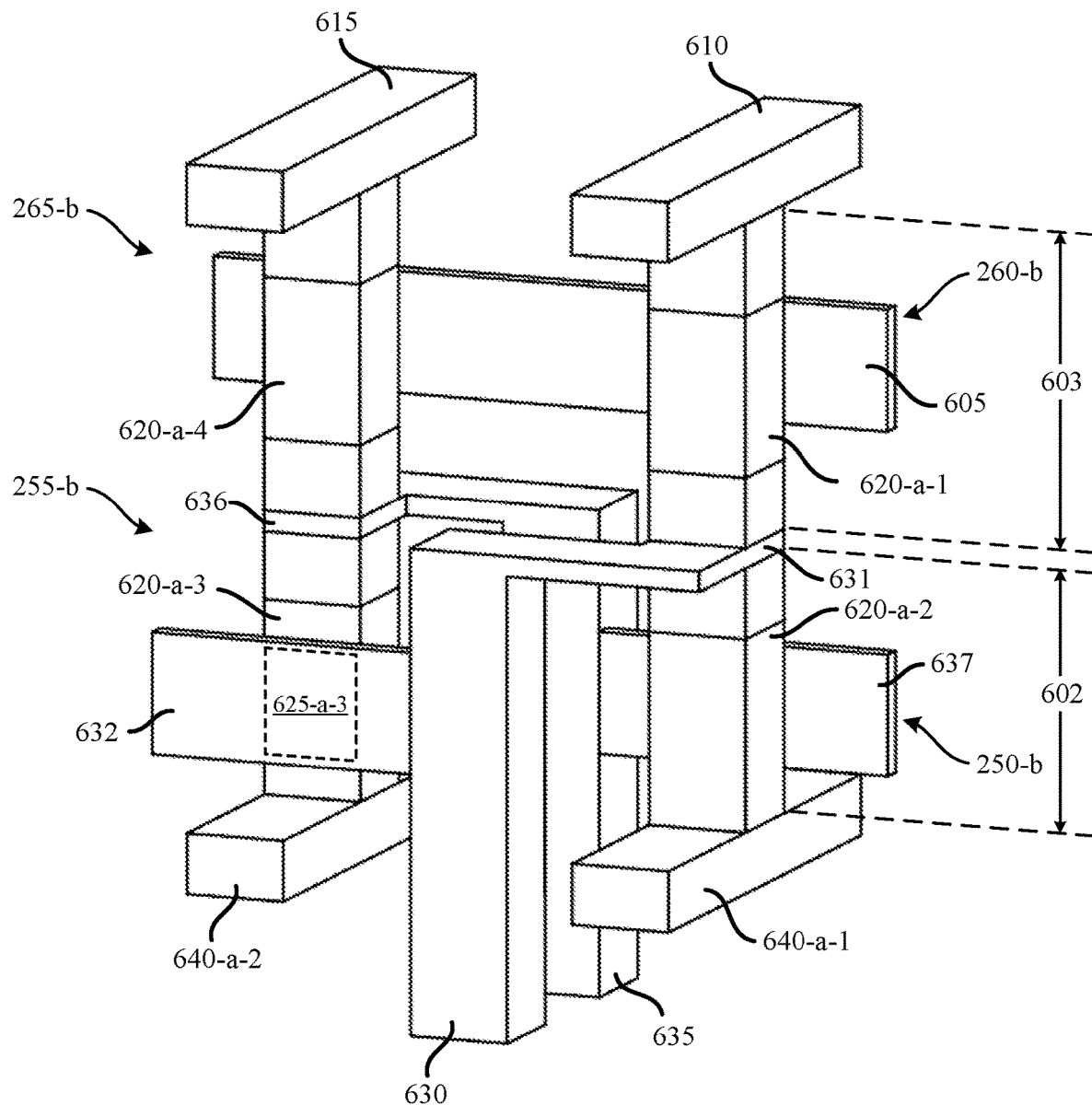

FIGS. 6A and 6B provide illustrations of a memory structure 600 that may support thin film random access memory in accordance with examples as disclosed herein. FIG. 6A provides a first diagonal view of the memory structure 600, and FIG. 6B provides a second diagonal view of the memory structure 600. For illustrative purposes, aspects of the memory structure 600 may be described with reference to an x-direction, a y-direction, and a z-direction of a coordinate system 601. In some examples, the z-direction may be illustrative of a direction perpendicular to a surface of a substrate (e.g., a surface in an xy-plane, a surface upon or over which other materials may be deposited). In some examples, the x-direction may be aligned with or referred to as a row direction (e.g., of a row of memory cells 105), and the y-direction may be aligned with or referred to as a column direction (e.g., of a column of memory cells). The illustrations of the memory structure 600 include physical spacing or separation between certain components intended to be electrically isolated, but such spaces or separation may include or be occupied by one or more materials, such as a dielectric material, that have been omitted for illustrative clarity.

In some examples, the memory structure 600 may include or be an example of one or more aspects of a second portion 295 of a memory cell 105, which may be formed over a substrate 320 or over a first portion 290 of the memory cell 105 (not shown). For example, the memory structure 600 may be associated with a cross-sectional area (e.g., a span or extent in the x-direction and y-direction, a span or extent in an xy-plane) or a pitch (e.g., distance of repetition along the x-direction for an array of memory cells 105, distance of repetition along the y-direction for an array of memory cells 105). In examples where the memory structure 600 is coupled with a first portion 290 for the associated memory cell 105, the respective first portion 290 of each memory cell 105 may have a same or overlapping cross section (e.g., as viewed along the z-direction, in an xy-plane) as a cross section of the memory structure 600. In some examples, the pitch (e.g., along the x-direction, along the y-direction, or both) of the first portion 290 in an array of memory cells 105 may be the same as the pitch of the memory structure 600. To support an array of memory cells 105, one or more aspects of the memory structure 600 may be repeated or extended along the x-direction to support a row of memory cells 105, and one or more aspects of the memory structure 600 may be repeated or extended along the y-direction to support a column of memory cells.

The memory structure 600 includes a word line conductor 605 (e.g., a portion of a word line 120, which may extend from one memory cell 105 to another memory cell 105 along a row direction), which may be operable to activate or select the memory cell 105 illustrated in part by the memory structure 600. For example, activating the memory cell 105 associated with the memory structure 600 may provide access to one or more structures representative of a node 230 (e.g., node conductor 630 or portion thereof, an A node), or one or more structures representative of a node 235 (e.g., node conductor 635 or portion thereof, a B node), or both. The node conductor 630 may be accessed via bit line conductor 610 (e.g., a portion of a bit line 130, which may extend from one memory cell 105 to another memory cell 105 along a column direction), and the node conductor 635 may be accessed via bit line conductor 615 (e.g., a portion of a bit line 135, which may extend from one memory cell 105 to another memory cell 105 along a column direction). The node conductor 630 and the node conductor 635, or respective portions thereof, may extend along the z-direction (e.g., downward) towards a substrate 320, or may be coupled with a conductor that otherwise extends along the z-direction, which may provide access to the node 230 and the node 235 for a first portion 290 of the memory cell 105 (e.g., for coupling with one or more substrate-based transistors, one or more planar transistors, a T5 and a T6 transistor). For example, the node conductor 630, the node conductor 635, or both may be coupled with a terminal 370, coupled with a doped portion 340-a of a substrate 320, or coupled with a gate portion 350, or various combinations thereof.

The memory structure 600 may include a transistor 260-b (e.g., a T1 transistor) including a channel portion (e.g., a vertical channel) formed at least in part by the pillar 620-a-1, and a gate portion 625-a-1 (e.g., a portion or region of the word line conductor 605, a gate conductor having a height dimension that is within or overlapping with a height dimension of the pillar 620-a-1) that is operable to activate the channel portion. The memory structure 600 may also include a transistor 250-b (e.g., a T2 transistor) including a channel portion (e.g., a vertical channel) formed at least in part by the pillar 620-a-2, and a gate portion 625-a-2 (e.g., a portion or region of the node conductor 635, a portion or region of a conductor 637 of or coupled with the node conductor 635 and extending along the x-direction, a gate conductor having a height dimension that is within or overlapping with a height dimension of the pillar 620-a-2) that is operable to activate the channel portion. The transistor 260-b may be coupled with the transistor 250-b via a conductor 631 (e.g., a conductor in physical or electrical contact with a bottom end of the pillar 620-a-1 and in physical or electrical contact with a top end of the pillar 620-a-2, a conductor of a layer or level that is between layers or levels associated with the pillar 620-a-1 and the pillar 620-a-2, an electrode), which may be coupled with the node conductor 630 or may be a portion of the node conductor 630. The transistor 250-b may be coupled with a voltage source 280 via a conductor 640-a-1, which may be an example of or be otherwise coupled with a node 285, and which may extend from one memory cell 105 to another memory cell 105 along a column direction.

The memory structure 600 may also include a transistor 255-b (e.g., a T3 transistor) including a channel portion (e.g., a vertical channel) formed at least in part by the pillar 620-a-3, and a gate portion 625-a-3 (e.g., a portion or region of the node conductor 630, a portion or region of a conductor 632 coupled with the node conductor 630 and extending along the x-direction, a gate conductor having a height dimension that is within or overlapping with a height dimension of the pillar 620-a-3) that is operable to activate the channel portion. The memory structure 600 may also include a transistor 265-b (e.g., a T4 transistor) including a channel portion (e.g., a vertical channel) formed at least in part by the pillar 620-a-4, and a gate portion 625-a-4 (e.g., a portion or region of the word line conductor 605, a gate conductor having a height dimension that is within or overlapping with a height dimension of the pillar 620-a-4) that is operable to activate the channel portion. The transistor 265-b may be coupled with the transistor 255-b via a conductor 636 (e.g., a conductor in contact with a bottom end of the pillar 620-a-4 and in contact with a top end of the pillar 620-a-3, a conductor of a layer or level that is between layers or levels associated with the pillar 620-a-3 and the pillar 620-a-3, an electrode), which may be coupled with the node conductor 635 or may be a portion of the node conductor 635. The transistor 255-b may be coupled with a voltage source 280 via a conductor 640-a-2, which may be an example of or be otherwise coupled with a node 285, and which may extend from one memory cell 105 to another memory cell 105 along a column direction.

The memory structure 600 illustrates an example of structures that may support a memory cell 105 having multiple physical layers or levels of thin film transistors (e.g., layers or levels of vertical transistors, layers or levels in a height direction, layers or levels along the z-direction), which may be coupled with substrate-based or planar transistors to form a collection of transistors operable to store a logic state. For example, the memory structure 600 includes a first subset of transistors (e.g., transistors 260-b and 265-b of a level 603) having a first height dimension relative to a substrate and a second subset of transistors (e.g., transistors 250-b and 255-b of a level 602) having a second height dimension relative to the substrate (e.g., different than the second height dimension, lower than the transistors 260-b and 265-b). In various examples, the absolute height (e.g., length or dimension in the z-direction) of each subset may be the same, or the absolute height of the subsets may be different, which may support tuning respective transistors for particular electrical characteristics. In some examples (e.g., as illustrated), a cross section in an xy-plane of pillars 620 or respective transistors of one layer or level may coincide with or otherwise overlap with a cross section in the xy-plane of pillars 620 or respective transistors of another layer (e.g., located at a different height in the z-direction). In other examples, a cross section in an xy-plane of pillars 620 or respective transistors of one layer or level may not coincide with or may be otherwise non-overlapping with a cross section in the xy-plane of pillars 620 or respective transistors of another layer.

The pillars 620 of the memory structure 600 may include various materials or material portions to support the functionality as described herein. For example, when the transistors 250-b, 255-b, 260-b, and 265-b are configured as n-type transistors, each of the pillars 620-a may include at least a p-type semiconductor portion, or may include a stack (e.g., in the z-direction) of an n-type semiconductor, a p-type semiconductor, and an n-type semiconductor (e.g., in a vertical NPN arrangement), among other constituent materials or arrangements. The pillars 620 may be formed according to various techniques. In some examples, one or more layers or stacks of layers (e.g., of doped semiconductor material) may be deposited on or above a substrate, and portions of the deposited layers located between respective pillars 620 (e.g., along the x-direction, along the y-direction) may be etched away or trenched to form the pillars 620. Additionally or alternatively, in some examples, holes or trenches may be etched through a material (e.g., in the z-direction, through a dielectric material, through a gate dielectric material) and material for the pillars 620 may be deposited in the etched holes or trenches. In various examples, one or more of the pillars 620 may include an electrode or other interfacing material portion between a doped semiconductor portion and another component that is in physical or electrical contact with the pillar 620 (e.g., at one or both ends of the pillar 620 along the z-direction).

In some examples, pillars 620, or sub-components thereof, of neighboring transistors may be aligned along certain directions to support or facilitate various operations or interconnection. For example, where channel portions of the transistors 260-b and 265-b are operable based on a common word line (e.g., word line conductor 605), at least a face of the pillar 620-a-1 and a face of the pillar 620-a-4 (e.g., respective faces pointing in a negative y-direction) may be aligned or coincident (e.g., coplanar) to facilitate a common or similar relative positioning or separation from the word line conductor 605 (e.g., across a gate dielectric, not shown). More generally, pillars 620 (e.g., of a common layer or level of pillars 620 in the z-direction, across different layers or levels of pillars 620) may be aligned along the x-direction (e.g., a row direction), along the y-direction (e.g., a column direction), or both, which may facilitate various manufacturing operations (e.g., trenching operations, etching operations, deposition operations, alignment operations).

Although the memory structure 600 illustrates transistors each having a single pillar 620, the techniques described and illustrated may be modified to include multiple pillars 620 for a given transistor. Further, transistors of different levels or layers of pillars 620 may include a same quantity of pillars 620 (e.g., operative pillars) for each transistor or a different quantity of pillars 620. Moreover, one or more of the levels or layers of pillars 620 (e.g., a first level or layer including pillars 620-a-1 and 620-a-4, a second level or layer including pillars 620-a-2 and 620-a-3) may include dummy pillars, which may not be configured to be activated by any gate conductors. In such examples, dummy pillars may or may not have a same height dimension as other pillars in the level or layer.

In some examples, a memory structure configurable to combine substrate-based transistors with thin film transistors of multiple levels, such as the memory structure 600, may support increased memory cell density compared with memory structures configured with thin film transistors of a single level. For example, a memory cell configured with such structures may extend from a substrate by a greater dimension, or according to more manufacturing levels or layers, which may provide more separation distance (e.g., for dielectric separation or other electrical isolation), such as separation between components of a same level or layer, or separation between components of different levels or layers, or both. In some examples, such configurations may support thin film transistors having relatively larger features, such as larger cross-sectional area (e.g., in an xy-plane), within a pitch or cross section of a memory cell 105 (e.g., of an underlying set of one or more substrate-based transistors). Further, in some examples, such as the memory structure 600, substrate-based transistors may be configured with a first channel type, and thin film transistors above such substrate-based transistors may be configured with a second channel type, which may leverage manufacturing techniques known or applied for other structures in a memory die (e.g., for decoder components, for multiplexer components).

Figure 7A:
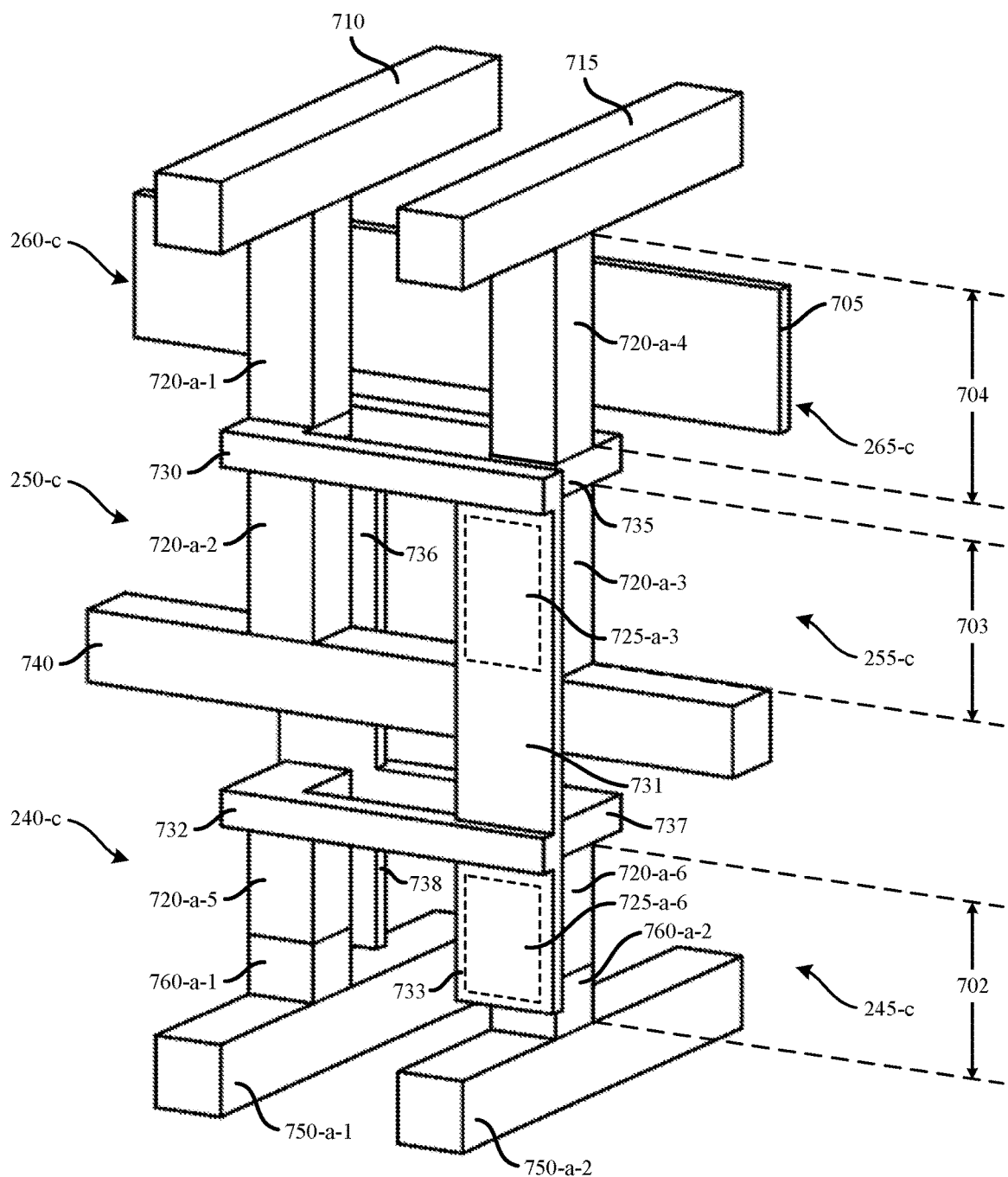

FIGS. 7A and 7B provide illustrations of a memory structure 700 that may support thin film random access memory in accordance with examples as disclosed herein. FIG. 7A provides a first diagonal view of the memory structure 700, and FIG. 7B provides a second diagonal view of the memory structure 700. For illustrative purposes, aspects of the memory structure 700 may be described with reference to an x-direction, a y-direction, and a z-direction of a coordinate system 701. In some examples, the z-direction may be illustrative of a direction perpendicular to a surface of a substrate (e.g., a surface in an xy-plane, a surface upon or over which other materials may be deposited) where, in various examples, the positive z-direction may point towards a substrate or the positive z-direction may point away from a substrate. In some examples, the x-direction may be aligned with or referred to as a row direction (e.g., of a row of memory cells 105), and the y-direction may be aligned with or referred to as a column direction (e.g., of a column of memory cells). The illustrations of the memory structure 700 include physical spacing or separation between certain components intended to be electrically isolated, but such spaces or separation may include or be occupied by one or more materials, such as a dielectric material, that have been omitted for illustrative clarity.

The memory structure 700 illustrates an example of a memory cell 105 having a plurality of transistors that may be formed above a substrate (e.g., without substrate-based or planar transistors) and configured to store one or more logic states. In the example of memory structure 700, such transistors may be associated with (e.g., included in, formed within) a plurality of layers or levels in the z-direction, such as level 702, level 703, and level 704, or in otherwise non-overlapping dimensions in the z-direction. The memory structure 700 may be associated with a cross-sectional area (e.g., a span or extent in the x-direction and y-direction, a span or extent in an xy-plane) or a pitch (e.g., distance of repetition along the x-direction for an array of memory cells 105, distance of repetition along the y-direction for an array of memory cells 105). To support an array of memory cells 105, one or more aspects of the memory structure 700 may be repeated or extended along the x-direction to support a row of memory cells 105, and one or more aspects of the memory structure 700 may be repeated or extended along the y-direction to support a column of memory cells. In some examples, one or more aspects of the memory structure 700 may be repeated along the z-direction, which may be implemented to support another portion of an array of memory cells 105, or another (e.g., separate) array of memory cells 105 (e.g., another deck of memory cells 105). In such examples, the relative positioning of components along the z-direction between two or more decks (e.g., adjacent decks) may be swapped (e.g., mirror symmetric across an xy-plane), such that decks adjacent along the z-direction may share common features such as common bit lines 130 or 135, or common voltage source conductors, among other features.

The memory structure 700 may include a word line conductor 705 (e.g., a portion of a word line 120, which may extend from one memory cell 105 to another memory cell 105 along a row direction), which may be operable to activate or select the memory cell 105 illustrated by the memory structure 700. For example, activating the memory cell 105 associated with the memory structure 700 may provide access to one or more structures representative of a node 230 (e.g., node conductor 730 or portion thereof, an A node), or one or more structures representative of a node 235 (e.g., node conductor 735 or portion thereof, a B node), or both. The node conductor 730 may be accessed via bit line conductor 710 (e.g., a portion of a bit line 130, which may extend from one memory cell 105 to another memory cell 105 along a column direction), and the node conductor 735 may be accessed via bit line conductor 715 (e.g., a portion of a bit line 135, which may extend from one memory cell 105 to another memory cell 105 along a column direction). The node conductor 730 and the node conductor 735, or one or more respective portions thereof, may extend along the z-direction (e.g., toward a substrate, away from a substrate), or may be coupled with one or more other conductors that otherwise extends along the z-direction, which may provide various coupling or interconnection with transistors of different levels of the memory structure 700 (e.g., with a T2 transistor, a T3 transistor, a T5 transistor, or a T6 transistor, or a combination thereof, with one or more channel portions, or one or more gate portions, or various combinations thereof).

The memory structure 700 may include a transistor 260-c (e.g., a T1 transistor, of level 704) including a channel portion (e.g., a vertical channel) formed at least in part by the pillar 720-a-1, and a gate portion 725-a-1 (e.g., a portion or region of the word line conductor 705, a gate conductor having a height dimension that is within or overlapping with a height dimension of the pillar 720-a-1) that is operable to activate the channel portion. The memory structure 700 may also include a transistor 250-c (e.g., a T2 transistor, of level 703) including a channel portion (e.g., a vertical channel) formed at least in part by the pillar 720-a-2, and a gate portion 725-a-2 (e.g., a portion or region of the node conductor 735, a portion or region of a conductor 736 of or coupled with the node conductor 735 and extending along the z-direction, a gate conductor having a height dimension that is overlapping with a height dimension of the pillar 720-a-2) that is operable to activate the channel portion.

The transistor 260-c may be coupled with the transistor 250-c via the node conductor 730 (e.g., a conductor in physical or electrical contact with a bottom end of the pillar 720-a-1 and in physical or electrical contact with a top end of the pillar 720-a-2, a conductor of a layer or level that is between pillars 720-a-1 and 720-a-2 or between the levels 703 and 704, an electrode). The transistor 250-c may be coupled with a voltage source 280 via a conductor 740 (e.g., in physical or electrical contact with a bottom end of the pillar 720-a-2, a conductor below or otherwise outside the level 703), which may be an example of or be otherwise coupled with a node 285, and which may extend from one memory cell 105 to another memory cell 105 along the x-direction (e.g., a row direction). The transistor 260-c may be coupled with the bit line conductor 710 (e.g., in physical or electrical contact with a top end of the pillar 720-a-1, a conductor above or otherwise outside the level 704).

The memory structure 700 may also include a transistor 255-c (e.g., a T3 transistor, of level 703) including a channel portion (e.g., a vertical channel) formed at least in part by the pillar 720-a-3, and a gate portion 725-a-3 (e.g., a portion or region of the node conductor 730, a portion or region of a conductor 731 coupled with the node conductor 730 and extending along the z-direction, a gate conductor having a height dimension that is overlapping with a height dimension of the pillar 720-a-3) that is operable to activate the channel portion. The memory structure 700 may also include a transistor 265-c (e.g., a T4 transistor, of level 704) including a channel portion (e.g., a vertical channel) formed at least in part by the pillar 720-a-4, and a gate portion 725-a-4 (e.g., a portion or region of the word line conductor 705, a gate conductor having a height dimension that is within or overlapping with a height dimension of the pillar 720-a-4) that is operable to activate the channel portion.

The transistor 265-c may be coupled with the transistor 255-c via the node conductor 735 (e.g., a conductor in physical or electrical contact with a bottom end of the pillar 720-a-4 and in physical or electrical contact with a top end of the pillar 720-a-3, a conductor of a layer or level that is between the pillars 720-a-3 and pillar 720-a-3 or between the levels 703 and 704, an electrode). The transistor 255-c may be coupled with a voltage source 280 via the conductor 740 (e.g., in physical or electrical contact with a bottom end of the pillar 720-a-3, a conductor below or otherwise outside the level 703). The transistor 265-c may be coupled with the bit line conductor 715 (e.g., in physical or electrical contact with a top end of the pillar 720-a-4, a conductor above or otherwise outside the level 704).

The memory structure 700 may also include a transistor 240-c (e.g., a T5 transistor, of level 702) including a channel portion (e.g., a vertical channel) formed at least in part by the pillar 720-a-5, and a gate portion 725-a-5 (e.g., a portion or region of the node conductor 735, a portion or region of a conductor 738 coupled with the node conductor 735 and extending along the z-direction, a gate conductor having a height dimension that is overlapping with a height dimension of the pillar 720-a-5) that is operable to activate the channel portion.

The transistor 240-c may be coupled with the transistors 250-c and 260-c via the conductor 732, via the conductor 731, or both, either or both of which may be coupled with the node conductor 730 or may be a portion of the node conductor 730. The conductor 732 may be referred to as a conductor in contact with a top end of the pillar 720-a-5, or a conductor of a layer or level that is between the pillars 720-a-5 and 720-a-2 or between the levels 702 and 703, or an electrode. The transistor 240-c may be coupled with a voltage source 270 via the conductor 750-a-1 (e.g., in contact with a bottom end of the pillar 720-a-5, a conductor below or otherwise outside the level 702), which may be an example of or be otherwise coupled with a node 275, and which may extend from one memory cell 105 to another memory cell 105 along the y-direction (e.g., a column direction). In the example of memory structure 700, the pillar 720-a-5 may include or be associated with an electrode 760-a-1, which may be formed from a metal or metal alloy. In some examples, the electrode 760-a-1 may be omitted.

The memory structure 700 may also include a transistor 245-c (e.g., a T6 transistor, of level 702) including a channel portion (e.g., a vertical channel) formed at least in part by the pillar 720-a-6, and a gate portion 725-a-6 (e.g., a portion or region of the node conductor 730, a portion or region of a conductor 733 coupled with the node conductor 730 and extending along the z-direction, a gate conductor having a height dimension that is overlapping with a height dimension of the pillar 720-a-6) that is operable to activate the channel portion.

The transistor 245-c may be coupled with the transistors 255-c and 265-c via the conductor 737, via the conductor 736, or both, either or both of which may be coupled with the node conductor 735 or may be a portion of the node conductor 735. The conductor 737 may be referred to as a conductor in contact with a top end of the pillar 720-a-6, or a conductor of a layer or level that is between the pillars 720-a-6 and 720-a-3 or between the levels 702 and 703, or an electrode. The transistor 245-c may be coupled with a voltage source 270 via the conductor 750-a-2 (e.g., in contact with a bottom end of the pillar 720-a-6, a conductor below or otherwise outside the level 702), which may be an example of or be otherwise coupled with a node 275, and which may extend from one memory cell 105 to another memory cell 105 along the y-direction (e.g., a column direction). In the example of memory structure 700, the pillar 720-a-6 may include or be associated with an electrode 760-a-2, which may be formed from a metal or metal alloy. In some examples, the electrode 760-a-2 may be omitted.

The memory structure 700 illustrates an example of structures that may support a memory cell 105 having multiple layers or levels of thin film transistors (e.g., layers or levels of vertical transistors, layers or levels in a height direction, layers or levels along the z-direction). For example, the memory structure 700 includes a first set of transistors (e.g., transistors 240-c and 245-c) associated with a first level relative to a substrate (e.g., level 702), a second set of transistors (e.g., transistors 250-c and 255-c) associated with a second level relative to the substrate (e.g., level 703), and a third set of transistors (e.g., transistors 260-c and 265-c) associated with a third level relative to the substrate (e.g., level 704). Each of the transistors of a respective set or level may include a channel portion formed at least in part by a pillar 720-a extending in a direction from the substrate (e.g., at least in part along the z-direction) and within the corresponding level (e.g., in the z-direction). Each of the transistors of a respective set may also include a gate portion that is physically separated from the channel portion by a gate dielectric, and that is formed at least in part by a conductor or conductor portion within the corresponding level.

In some examples, transistors of a given set or level may be associated with different configuration or functionality. For example, in the memory structure 700, transistors of the first set (e.g., of the level 702, a first cross-coupled pair of transistors having a first channel type) may be configured for latching a logic state based at least in part on a first voltage source (e.g., a voltage source 270), transistors of the second set (e.g., of the level 703, a second cross-coupled pair of transistors having a second channel type) may be configured for latching a logic state based at least in part on a second voltage source (e.g., a voltage source 280), and transistors of the third set (e.g., of the level 704, cell selection transistors) may be configured for accessing the memory cell 105 of the memory structure 700 (e.g., for coupling the node conductor 730 and the node conductor 735 with a sense component). In some examples, transistors of a given set or level may be configured with a same channel type. For example, transistors of the level 702 may be configured with a p-type channel, transistors of the level 703 may be configured with an n-type channel, and transistors of the level 704 may be configured with an n-type channel. Although the memory structure 700 illustrates an example where transistors 250-c and 255-c are positioned in a middle level of transistors (e.g., between a first level including transistors 240-c and 245-c and a second level including transistors 260-c and 265-c, along a z-direction), in other examples, transistors 240-c and 245-c may be positioned in a middle level of transistors (e.g., between a first level including transistors 250-c and 255-c and a second level including transistors 260-c and 265-c). In other words, in some examples, the relative positioning of levels 702 and 703 (e.g., the order relative to the level 704) may be swapped (e.g., reversed).

In various examples, the absolute height (e.g., length or dimension of pillars 720, in the z-direction) of each set or level may be the same, or the absolute height of the sets or levels may be different, which may support tuning respective transistors for particular electrical characteristics. In some examples (e.g., as illustrated), a cross section in an xy-plane of pillars 720 or respective transistors of one set or level may coincide with or otherwise overlap with (e.g., when viewed along the z-direction) a cross section in the xy-plane of pillars 720 or respective transistors of another layer (e.g., located at a different height in the z-direction). In other examples, a cross section in an xy-plane of pillars 720 or respective transistors of one set or level may not coincide with or may be otherwise non-overlapping with a cross section in the xy-plane of pillars 720 or respective transistors of another layer.

The pillars 720 of the memory structure 700 may include various materials or material portions to support the functionality as described herein. For example, when the transistors 250-c, 255-c, 260-c, and 265-c are configured as n-type transistors, each of the associated pillars 720-a may include at least a p-type semiconductor portion, or may include a stack (e.g., in the z-direction) of an n-type semiconductor, a p-type semiconductor, and an n-type semiconductor (e.g., in a vertical NPN arrangement), among other constituent materials or arrangements. When the transistors 240-c and 245-c configured as p-type transistors, each of the associated pillars 720-a may include at least an n-type semiconductor portion, or may include a stack (e.g., in the z-direction) of an p-type semiconductor, an n-type semiconductor, and a p-type semiconductor (e.g., in a vertical PNP arrangement), among other constituent materials or arrangements.

The pillars 720 may be formed according to various techniques. In some examples, one or more layers or stacks of layers (e.g., of doped semiconductor material) may be deposited on or above a substrate, and portions of the deposited layers located between respective pillars 720 (e.g., along the x-direction, along the y-direction) may be etched away or trenched to form the pillars 720. Additionally or alternatively, in some examples, holes or trenches may be etched through a material (e.g., in the z-direction, through a dielectric material, through a gate dielectric material) and material for the pillars 720 may be deposited in the etched holes or trenches. In various examples, one or more of the pillars 720 may include an electrode or other interfacing material portion between a doped semiconductor portion and another component that is in physical or electrical contact with the pillar 720 (e.g., at one or both ends of the pillar 720 along the z-direction).

In some examples, pillars 720, or sub-components thereof, of neighboring transistors may be aligned along certain directions to support or facilitate various operations or interconnection. For example, where channel portions of the transistors 240-c and 250-c are operable based on a common conductor or coplanar conductors (e.g., gate portion 725-a-2 of conductor 736 and gate portion 725-a-5 of conductor 738, which may each be a portion of node conductor 735 extending along the z-direction), at least a face of the pillar 720-a-2 and a face of the pillar 720-a-5 (e.g., respective faces pointing in a positive y-direction) may be aligned or coincident (e.g., coplanar) to facilitate a common or similar relative positioning or separation from the corresponding gate portions (e.g., across a gate dielectric, not shown). More generally, pillars 720 (e.g., of a common layer or level of pillars 720 in the z-direction, across different layers or levels of pillars 720) may be aligned along the x-direction (e.g., a row direction), along the y-direction (e.g., a column direction), or both, which may facilitate various manufacturing operations (e.g., trenching operations, etching operations, deposition operations, alignment operations).

Although the memory structure 700 illustrates transistors each having a single pillar 720, the techniques described and illustrated may be modified to include multiple pillars 720 for a given transistor. Further, transistors of different levels or layers of pillars 720 may include a same quantity of pillars 720 (e.g., operative pillars) for each transistor or a different quantity of pillars 720. Moreover, one or more of the levels or layers of pillars 720 may include dummy pillars, which may not be configured to be activated by any gate conductors. In such examples, dummy pillars may or may not have a same height dimension as other pillars in the level or layer.

In some examples, a memory structure formed (e.g., entirely) using transistors with thin film transistors of multiple levels, such as the memory structure 700, may support increased memory cell density, increased design flexibility, or both, among other benefits. For example, a memory cell configured with such structures may extend from a substrate by a greater dimension, or according to more manufacturing levels or layers, which may provide more separation distance (e.g., for dielectric separation or other electrical isolation), such as separation between components of a same level or layer, or separation between components of different levels or layers, or both. Moreover, by omitting substrate-based transistors from a memory cell 105, memory structures such as memory structure 700 may be repeated along the z-direction (e.g., on or above a same substrate), providing even further flexibility for memory array design and density.

Figure 8A:
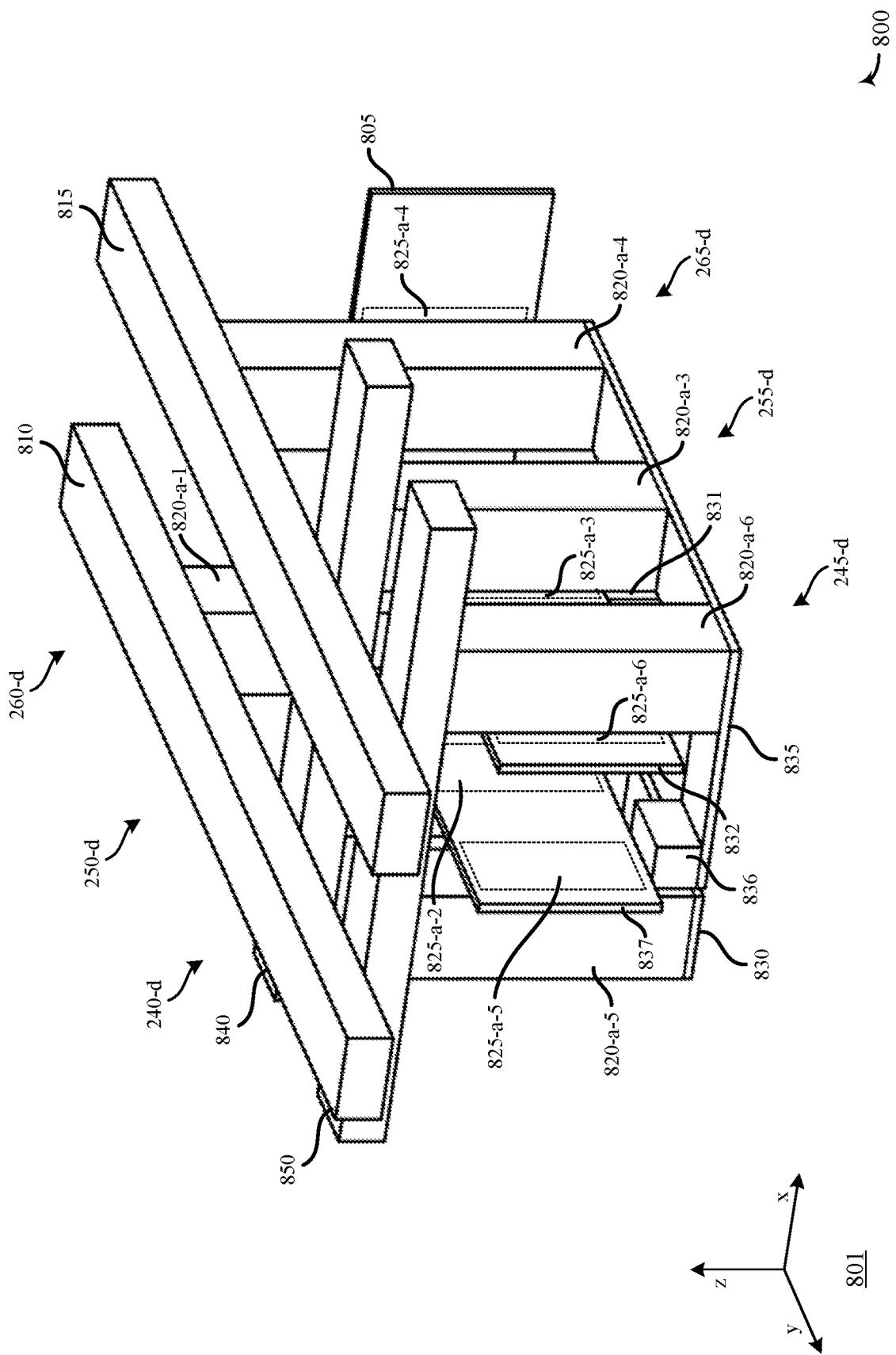
FIGS. 8A and 8B provide illustrations of a memory structure that may support thin film random access memory in accordance with examples as disclosed herein.
Figure 8B:
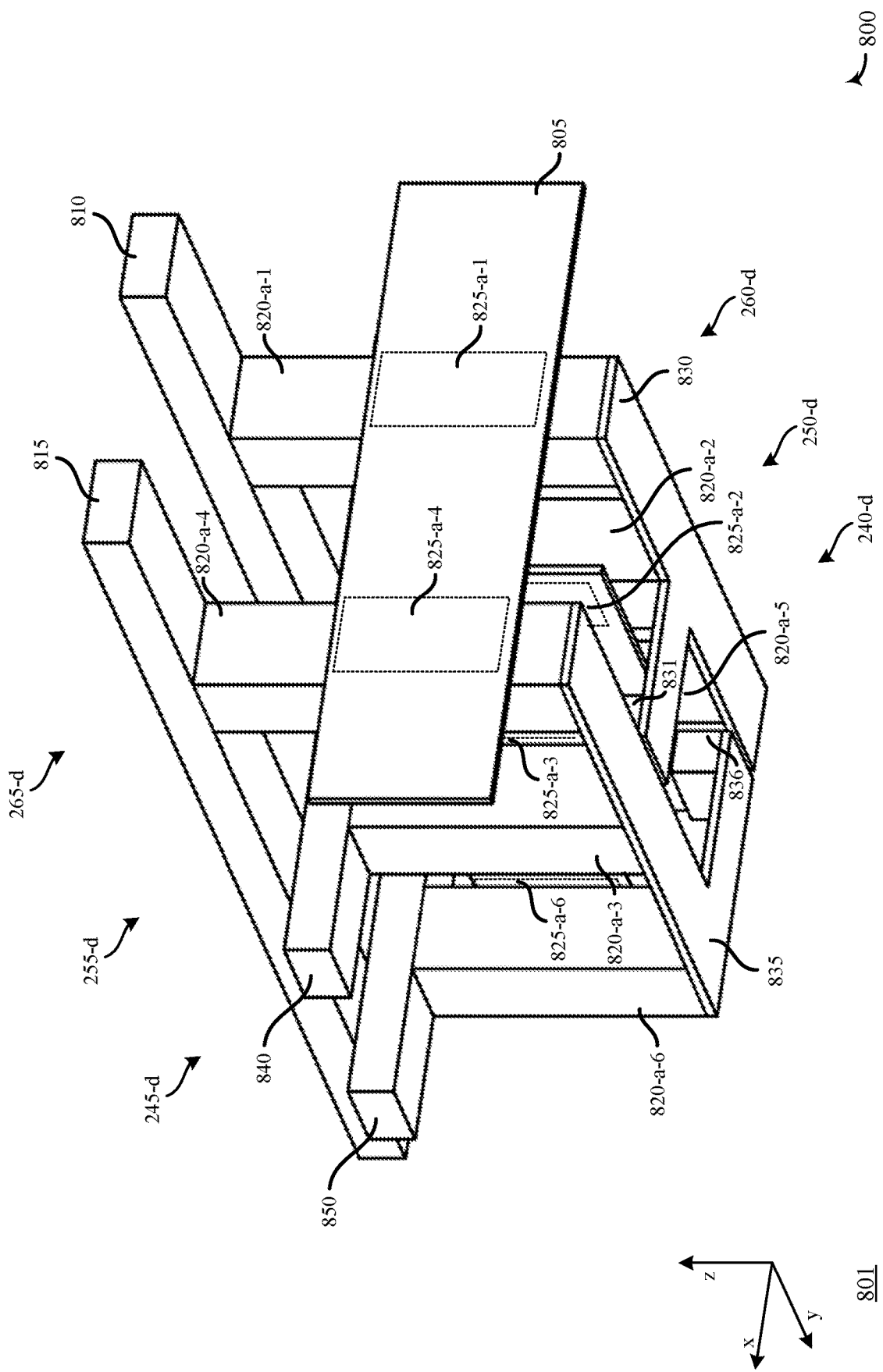

FIGS. 8A and 8B provide illustrations of a memory structure 800 that may support thin film random access memory in accordance with examples as disclosed herein. FIG. 8A provides a first diagonal view of the memory structure 800, and FIG. 8B provides a second diagonal view of the memory structure 800. For illustrative purposes, aspects of the memory structure 800 may be described with reference to an x-direction, a y-direction, and a z-direction of a coordinate system 801. In some examples, the z-direction may be illustrative of a direction perpendicular to a surface of a substrate (e.g., a surface in an xy-plane, a surface upon or over which other materials may be deposited) where, in various examples, the positive z-direction may point towards a substrate or the positive z-direction may point away from a substrate. In some examples, the x-direction may be aligned with or referred to as a row direction (e.g., of a row of memory cells 105), and the y-direction may be aligned with or referred to as a column direction (e.g., of a column of memory cells). The illustrations of the memory structure 800 include physical spacing or separation between certain components intended to be electrically isolated, but such spaces or separation may include or be occupied by one or more materials, such as a dielectric material, that have been omitted for illustrative clarity.

The memory structure 800 illustrates an example of a memory cell 105 having a plurality of transistors that may be formed above a substrate (e.g., without substrate-based or planar transistors) and configured to store one or more logic states. In the example of memory structure 800, such transistors may be associated with (e.g., included in, formed within) a common layer or level in the z-direction, or in otherwise overlapping dimensions in the z-direction. The memory structure 800 may be associated with a cross-sectional area (e.g., a span or extent in the x-direction and y-direction, a span or extent in an xy-plane) or a pitch (e.g., distance of repetition along the x-direction for an array of memory cells 105, distance of repetition along the y-direction for an array of memory cells 105). To support an array of memory cells 105, one or more aspects of the memory structure 800 may be repeated or extended along the x-direction to support a row of memory cells 105, and one or more aspects of the memory structure 800 may be repeated or extended along the y-direction to support a column of memory cells. In some examples, one or more aspects of the memory structure 800 may be repeated along the z-direction, which may be implemented to support another portion of an array of memory cells 105, or another (e.g., separate) array of memory cells 105 (e.g., another deck of memory cells 105). In such examples, the relative positioning of components along the z-direction between two or more decks (e.g., adjacent decks) may be swapped (e.g., mirror symmetric across an xy-plane), such that decks adjacent along the z-direction may share common features such as common bit lines 130 or 135, among other features.

The memory structure 800 may include a word line conductor 805 (e.g., a portion of a word line 120, which may extend from one memory cell 105 to another memory cell 105 along a row direction), which may be operable to activate or select the memory cell 105 illustrated by the memory structure 800. For example, activating the memory cell 105 associated with the memory structure 800 may provide access to one or more structures representative of a node 230 (e.g., node conductor 830 or portion thereof, an A node), or one or more structures representative of a node 235 (e.g., node conductor 835 or portion thereof, a B node), or both. The node conductor 830 may be accessed via bit line conductor 810 (e.g., a portion of a bit line 130, which may extend from one memory cell 105 to another memory cell 105 along a column direction), and the node conductor 835 may be accessed via bit line conductor 815 (e.g., a portion of a bit line 135, which may extend from one memory cell 105 to another memory cell 105 along a column direction). The node conductor 830 and the node conductor 835, or one or more respective portions thereof, may extend along the z-direction (e.g., toward a substrate, away from a substrate), or may be coupled with one or more other conductors that otherwise extends along the z-direction, which may provide various coupling or interconnection with transistors of a common level of the memory structure 800 (e.g., with or one or more gate portions of a T2 transistor, a T3 transistor, a T5 transistor, or a T6 transistor, or various combinations thereof).

The memory structure 800 may include a transistor 260-*d* (e.g., a T1 transistor) including a channel portion (e.g., a vertical channel) formed at least in part by the pillar 820-*a*-1, and a gate portion 825-*a*-1 (e.g., a portion or region of the word line conductor 805, a gate conductor having a height dimension that is within or overlapping with a height dimension of the pillar 820-*a*-1) that is operable to activate the channel portion. The gate portion 825-*a*-1 may be separated from the pillar 820-*a*-1 in the y-direction by a gate insulator.

The memory structure 800 may also include a transistor 250-*d* (e.g., a T2 transistor) including a channel portion (e.g., a vertical channel) formed at least in part by the pillar 820-*a*-2, and a gate portion 825-*a*-2 (e.g., a portion or region of the node conductor 835, a portion or region of a conductor 837 of or coupled with the node conductor 835 via a conductor 836 and extending along the y-direction, a gate conductor having a height dimension that is overlapping with a height dimension of the pillar 820-*a*-2) that is operable to activate the channel portion. The gate portion 825-*a*-2 may be separated from the pillar 820-*a*-2 in the x-direction by a gate insulator.

The memory structure 800 may also include a transistor 240-*d* (e.g., a T5 transistor) including a channel portion (e.g., a vertical channel) formed at least in part by the pillar 820-*a*-5, and a gate portion 825-*a*-5 (e.g., a portion or region of the node conductor 835, a portion or region of the conductor 837 coupled with the node conductor 835 via the conductor 836 and extending along the y-direction, a gate conductor having a height dimension that is overlapping with a height dimension of the pillar 820-*a*-5) that is operable to activate the channel portion. The gate portion 825-*a*-5 may be separated from the pillar 820-*a*-5 in the x-direction by a gate insulator.

In the example of memory structure 800, each of the transistors 240-*d*, 250-*d*, and 260-*d* may be coupled with each other via the node conductor 830 (e.g., a conductor in physical or electrical contact with a bottom end of the pillar 820-*a*-1, the pillar 820-*a*-2, and the pillar 820-*a*-5, an electrode). In some examples, each of the pillar 820-*a*-1, the pillar 820-*a*-2, and the pillar 820-*a*-5 may extend in a same direction (e.g., a positive z-direction) from the node conductor 830, which may or may not include extending from a common surface (e.g., a top surface) of the node conductor 830.

The transistor 260-*d* may be coupled with the bit line conductor 810 (e.g., in physical or electrical contact with a top end of the pillar 820-*a*-1). The transistor 250-*d* may be coupled with a voltage source 280 via a conductor 840 (e.g., in physical or electrical contact with a top end of the pillar 820-*a*-2), which may be an example of or be otherwise coupled with a node 285, and which may extend from one memory cell 105 to another memory cell 105 along the x-direction (e.g., a row direction). The transistor 240-*d* may be coupled with a voltage source 270 via a conductor 850 (e.g., in contact with a top end of the pillar 820-*a*-5), which may be an example of or be otherwise coupled with a node 275, and which may extend from one memory cell 105 to another memory cell 105 along the y-direction (e.g., a column direction).

The memory structure 800 may also include a transistor 265-*d* (e.g., a T4 transistor) including a channel portion (e.g., a vertical channel) formed at least in part by the pillar 820-*a*-4, and a gate portion 825-*a*-4 (e.g., a portion or region of the word line conductor 805, a gate conductor having a height dimension that is within or overlapping with a height dimension of the pillar 820-*a*-4) that is operable to activate the channel portion. The gate portion 825-*a*-4 may be separated from the pillar 820-*a*-4 in the y-direction by a gate insulator.

The memory structure 800 may also include a transistor 255-*d* (e.g., a T3 transistor) including a channel portion (e.g., a vertical channel) formed at least in part by the pillar 820-*a*-3, and a gate portion 825-*a*-3 (e.g., a portion or region of the node conductor 830, a portion or region of a conductor 832 coupled with the node conductor 830 via a conductor 831 and extending along the y-direction, a gate conductor having a height dimension that is overlapping with a height dimension of the pillar 820-*a*-3) that is operable to activate the channel portion. The gate portion 825-*a*-3 may be separated from the pillar 820-*a*-3 in the x-direction by a gate insulator.

The memory structure 800 may also include a transistor 245-*d* (e.g., a T6 transistor) including a channel portion (e.g., a vertical channel) formed at least in part by the pillar 820-*a*-6, and a gate portion 825-*a*-6 (e.g., a portion or region of the node conductor 830, a portion or region of the conductor 832 coupled with the node conductor 830 via the conductor 831 and extending along the y-direction, a gate conductor having a height dimension that is overlapping with a height dimension of the pillar 820-*a*-6) that is operable to activate the channel portion. The gate portion 825-*a*-6 may be separated from the pillar 820-*a*-6 in the x-direction by a gate insulator.

In the example of memory structure 800, each of the transistors 245-*d*, 255-*d*, and 265-*d* may be coupled with each other via the node conductor 835 (e.g., a conductor in physical or electrical contact with a bottom end of the pillar 820-*a*-3, the pillar 820-*a*-4, and the pillar 820-*a*-6, an electrode). In some examples, each of the pillar 820-*a*-3, the pillar 820-*a*-4, and the pillar 820-*a*-6 may extend in a same direction (e.g., a positive z-direction) from the node conductor 835, which may or may not include extending from a common surface (e.g., a top surface) of the node conductor 835.

The transistor 265-*d* may be coupled with the bit line conductor 815 (e.g., in physical or electrical contact with a top end of the pillar 820-*a*-4). The transistor 255-*d* may be coupled with a voltage source 280 via the conductor 840 (e.g., in physical or electrical contact with a top end of the pillar 820-*a*-3). The transistor 245-*d* may be coupled with a voltage source 270 via the conductor 850 (e.g., in contact with a top end of the pillar 820-*a*-5).

The memory structure 800 illustrates an example of structures that may support a memory cell 105 having a single layer or level of thin film transistors (e.g., vertical transistors), where each of the transistors of the memory cell 105 has a channel portion formed at least in part by a pillar 820-*a* that at least partially overlaps along the z-direction with each of the other pillars 820-*a* of the memory cell 105. Each of the transistors may also include a gate portion that is physically separated from the channel portion by a gate dielectric, and that is formed at least in part by a conductor or conductor portion within the corresponding level or corresponding pillar height.

In some examples, transistors of a given row (e.g., of transistors, of pillars 820-*a*, transistor structures along a row direction) may be associated with different configuration or functionality. For example, in the memory structure 800, transistors of a first set (e.g., transistors 250-*d* and 245-*d*, a first cross-coupled pair of transistors having a first channel type) may be configured for latching a logic state based at least in part on a first voltage source (e.g., a voltage source 270), transistors of a second set (e.g., transistors 250-*d* and 255-*d*, a second cross-coupled pair of transistors having a second channel type) may be configured for latching a logic state based at least in part on a second voltage source (e.g., a voltage source 280), and transistors of a third set (e.g., transistors 260-*d* and 265-*d*, cell selection transistors) may be configured for accessing the memory cell 105 of the memory structure 800 (e.g., for coupling the node conductor 830 and the node conductor 835 with a sense component).

In some examples, transistors of a given set or row may be configured with a same channel type. For example, transistors of the first set or row may be configured with a p-type channel, transistors of the second set or row may be configured with an n-type channel, and transistors of the third set or row may be configured with an n-type channel. Although the memory structure 800 illustrates an example where transistors 250-*d* and 255-*d* are positioned in a middle row of transistors (e.g., a second row, between a first row including transistors 240-*d* and 245-*d* and a third row including transistors 260-*d* and 265-*d*, along a y-direction), in other examples, transistors 240-*d* and 245-*d* may be positioned in a middle row of transistors (e.g., a second row, between a first row including transistors 250-*d* and 255-*d* and a third row including transistors 260-*d* and 265-*d*). In other words, in some examples, the relative positioning of rows or sets of transistors (e.g., the order relative to the transistors 260-*d* and 265-*d*) may be swapped (e.g., reversed).

In various examples, the absolute height (e.g., length or dimension of pillars 820, in the z-direction) of sets or rows may be the same, or the absolute height of the sets or rows may be different, which may support tuning respective transistors for particular electrical characteristics. Moreover, in some examples, the absolute height of pillars 820-*a*-1 and 820-*a*-4 may be greater than the absolute height of pillars 820-*a*-2, 820-*a*-3, 820-*a*-5, and 820-*a*-6, which may facilitate routing bit line conductors 810 and 815 over conductors 840 and 850.

The pillars 820 of the memory structure 800 may include various materials or material portions to support the functionality as described herein. For example, when the transistors 250-*d*, 255-*d*, 260-*d*, and 265-*d* are configured as n-type transistors, each of the associated pillars 820-*a* may include at least a p-type semiconductor portion, or may include a stack (e.g., in the z-direction) of an n-type semiconductor, a p-type semiconductor, and an n-type semiconductor (e.g., in a vertical NPN arrangement), among other constituent materials or arrangements. When the transistors 240-*d* and 245-*d* configured as p-type transistors, each of the associated pillars 820-*a* may include at least an n-type semiconductor portion, or may include a stack (e.g., in the z-direction) of an p-type semiconductor, an n-type semiconductor, and a p-type semiconductor (e.g., in a vertical PNP arrangement), among other constituent materials or arrangements.

The pillars 820 may be formed according to various techniques. In some examples, one or more layers or stacks of layers (e.g., of doped semiconductor material) may be deposited on or above a substrate, and portions of the deposited layers located between respective pillars 820 (e.g., along the x-direction, along the y-direction) may be etched away or trenched to form the pillars 820. Additionally or alternatively, in some examples, holes or trenches may be etched through a material (e.g., in the z-direction, through a dielectric material, through a gate dielectric material) and material for the pillars 820 may be deposited in the etched holes or trenches. In various examples, one or more of the pillars 820 may include an electrode or other interfacing material portion between a doped semiconductor portion and another component that is in physical or electrical contact with the pillar 820 (e.g., at one or both ends of the pillar 820 along the z-direction).

In some examples, pillars 820, or sub-components thereof, of neighboring transistors may be aligned along certain directions to support or facilitate various operations or interconnection. For example, where channel portions of the transistors 240-*d* and 250-*d* are operable based on a common conductor or coplanar conductors (e.g., gate portion 825-*a*-2 and gate portion 825-*a*-5 of conductor 837, which be a portion of node conductor 835 extending along the y-direction), at least a face of the pillar 820-*a*-2 and a face of the pillar 820-*a*-5 (e.g., respective faces pointing in a positive x-direction) may be aligned or coincident (e.g., coplanar) to facilitate a common or similar relative positioning or separation from the corresponding gate portions (e.g., across a gate dielectric, not shown). More generally, pillars 820 (e.g., of a common layer or level of pillars 820 in the z-direction, across different layers or levels of pillars 820) may be aligned along the x-direction (e.g., a row direction), along the y-direction (e.g., a column direction), or both, which may facilitate various manufacturing operations (e.g., trenching operations, etching operations, deposition operations, alignment operations).

Although the memory structure 800 illustrates transistors each having a single pillar 820, the techniques described and illustrated may be modified to include multiple pillars 820 for a given transistor. Further, transistors of different levels or layers of pillars 820 may include a same quantity of pillars 820 (e.g., operative pillars) for each transistor or a different quantity of pillars 820. Moreover, the memory structure 800 may include or be otherwise associated with dummy pillars, which may not be configured to be activated by any gate conductors. In such examples, dummy pillars may or may not have a same height dimension as other pillars in the level or layer.

In some examples, a memory structure formed (e.g., entirely) using transistors with thin film transistors of a single level, such as the memory structure 800, may support increased design flexibility, reduced manufacturing complexity, reduced variability, or combinations thereof, among other benefits. For example, by omitting substrate-based transistors from a memory cell 105, memory structures such as the memory structure 800 may be repeated along the z-direction (e.g., on or above a same substrate), providing improved flexibility for memory array design and density. Moreover, by forming a memory cell 105 from transistors of a single level, sub-component interconnections may be simplified in some aspects. Further, by employing fewer manufacturing operations (e.g., that would otherwise be associated with building multiple layers or levels of transistors for a same memory cell), physical or operational variability may be reduced (e.g., by leveraging common manufacturing operations for shared components of a memory cell, by reducing a stack of manufacturing operations that may project material or surface irregularities from one layer or level to the next).

FIG. 9 shows a flowchart illustrating a method 900 that supports thin film transistor random access memory in accordance with examples as disclosed herein. The operations of method 900 may be implemented by a manufacturing system or one or more controllers associated with a manufacturing system. In some examples, one or more controllers may execute a set of instructions to control the functional elements of the manufacturing system to perform the described functions. Additionally or alternatively, one or more controllers may perform aspects of the described functions using special-purpose hardware.

At 905, the method may include forming a memory cell including a plurality of transistors configured to store a logic state. In some examples, forming the memory cell may include forming a first set of one or more transistors (e.g., of a second portion 295), each comprising a respective gate portion including a conductor formed above a substrate, and each comprising a respective channel portion including a pillar formed above the substrate and configured to be activated based at least in part on a voltage of the respective gate portion. In some examples, forming the memory cell may include forming a second set of one or more transistors (e.g., of a first portion 290), each comprising a respective gate portion including a conductor formed above the substrate, and each comprising a respective channel portion including a doped portion of the substrate that is configured to be activated based at least in part on a voltage of the respective gate portion. The operations of 905 may be performed in accordance with examples and techniques as disclosed herein, including one or more aspects described with reference to FIGS. 4A through 4F, 5A through 5E, 6A, and 6B.

In some examples, an apparatus as described herein may perform a method or methods, such as the method 900. The apparatus may include, features, circuitry, logic, means, or instructions (e.g., a non-transitory computer-readable medium storing instructions executable by a processor) for forming a memory cell including a plurality of transistors configured to store a logic state. In some examples, forming the memory cell may include features, circuitry, logic, means, or instructions for forming a first set of one or more transistors (e.g., of a second portion 295), each comprising a respective gate portion including a conductor formed above a substrate, and each comprising a respective channel portion including a pillar formed above the substrate and configured to be activated based at least in part on a voltage of the respective gate portion. In some examples, forming the memory cell may include features, circuitry, logic, means, or instructions for forming a second set of one or more transistors (e.g., of a first portion 290), each comprising a respective gate portion including a conductor formed above the substrate, and each comprising a respective channel portion including a doped portion of the substrate that is configured to be activated based at least in part on a voltage of the respective gate portion.

Figure 10:
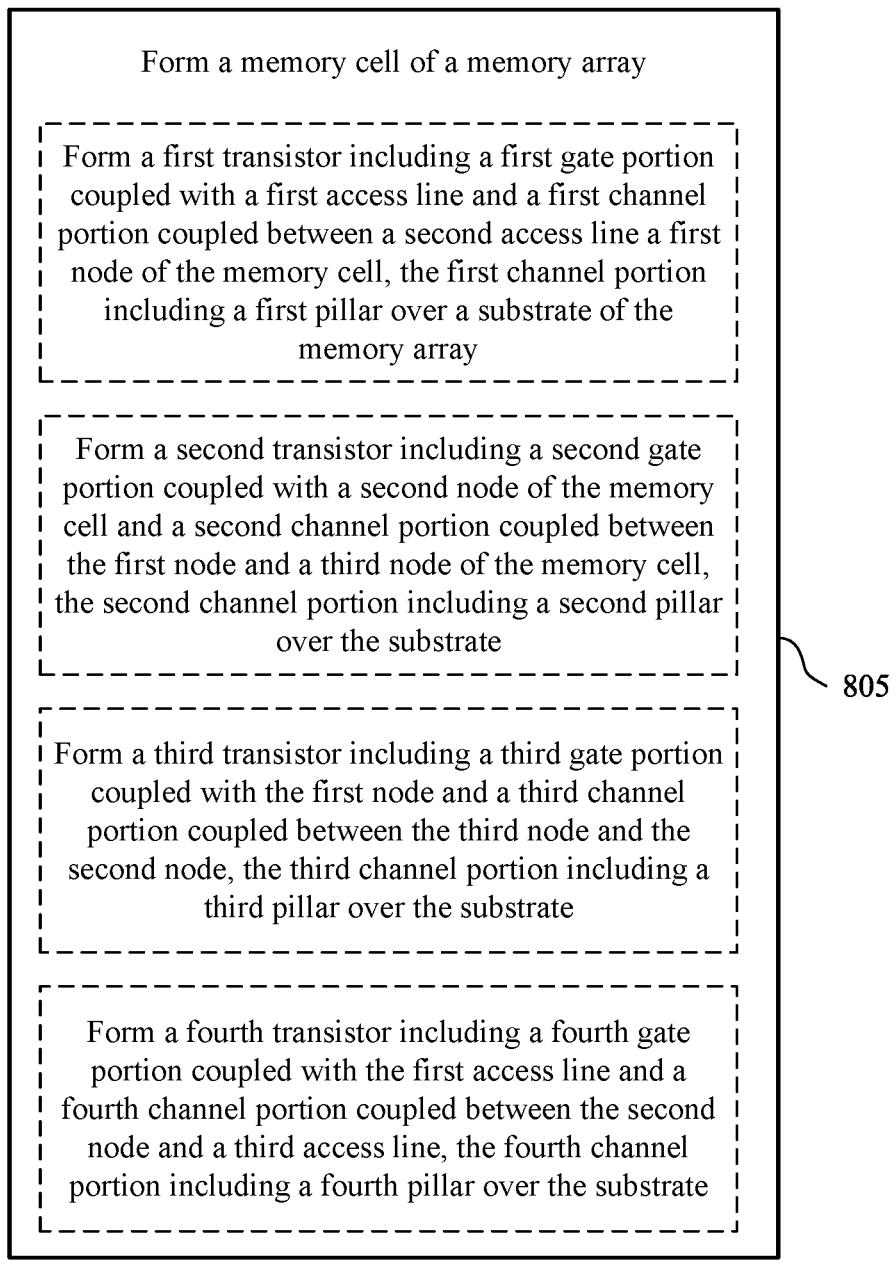

FIG. 10 shows a flowchart illustrating a method 1000 that supports thin film transistor random access memory in accordance with examples as disclosed herein. The operations of method 1000 may be implemented by a manufacturing system or one or more controllers associated with a manufacturing system. In some examples, one or more controllers may execute a set of instructions to control the functional elements of the manufacturing system to perform the described functions. Additionally or alternatively, one or more controllers may perform aspects of the described functions using special-purpose hardware.

At 1005, the method may include forming a memory cell of a memory array. In some examples, forming the memory cell may include forming a first transistor (e.g., a transistor 260, a T1 transistor) including a first gate portion coupled with a first access line (e.g., a word line 120) and a first channel portion coupled between a second access line (e.g., a bit line 130) and a first node of the memory cell (e.g., a node 230, an A node), the first channel portion including a first pillar over a substrate of the memory array.

In some examples, forming the memory cell may include forming a second transistor (e.g., a transistor 250, a T2 transistor) including a second gate portion coupled with a second node of the memory cell (e.g., a node 235, a B node) and a second channel portion coupled between the first node and a third node (e.g., a node 285, a ground node, a source voltage node) of the memory cell, the second channel portion including a second pillar over the substrate. In some examples, forming the memory cell may include forming a third transistor (e.g., a transistor 255, a T3 transistor) including a third gate portion coupled with the first node and a third channel portion coupled between the third node and the second node, the third channel portion including a third pillar over the substrate.

In some examples, forming the memory cell may include forming a fourth transistor (e.g., a transistor 265, a T4 transistor) including a fourth gate portion coupled with the first access line and a fourth channel portion coupled between the second node and a third access line (e.g., a bit line 135), the fourth channel portion including a fourth pillar over the substrate. The operations of 1005 may be performed in accordance with examples and techniques as disclosed herein, including one or more aspects described with reference to FIGS. 4A through 4F, 5A through 5E, 6A, and 6B.

In some examples, an apparatus as described herein may perform a method or methods, such as the method 1000. The apparatus may include, features, circuitry, logic, means, or instructions (e.g., a non-transitory computer-readable medium storing instructions executable by a processor) for forming a memory cell of a memory array In some examples, forming the memory cell may include features, circuitry, logic, means, or instructions for forming a first transistor (e.g., a transistor 260, a T1 transistor) including a first gate portion coupled with a first access line (e.g., a word line 120) and a first channel portion coupled between a second access line (e.g., a bit line 130) and a first node of the memory cell (e.g., a node 230, an A node), the first channel portion including a first pillar over a substrate of the memory array.

In some examples, forming the memory cell may include features, circuitry, logic, means, or instructions for forming a second transistor (e.g., a transistor 250, a T2 transistor) including a second gate portion coupled with a second node of the memory cell (e.g., a node 235, a B node) and a second channel portion coupled between the first node and a third node (e.g., a node 285, a ground node, a source voltage node) of the memory cell, the second channel portion including a second pillar over the substrate. In some examples, forming the memory cell may include features, circuitry, logic, means, or instructions for forming a third transistor (e.g., a transistor 255, a T3 transistor) including a third gate portion coupled with the first node and a third channel portion coupled between the third node and the second node, the third channel portion including a third pillar over the substrate.

In some examples, forming the memory cell may include features, circuitry, logic, means, or instructions for forming a fourth transistor (e.g., a transistor 265, a T4 transistor) including a fourth gate portion coupled with the first access line and a fourth channel portion coupled between the second node and a third access line (e.g., a bit line 135), the fourth channel portion including a fourth pillar over the substrate.

In some examples, the first transistor, the second transistor, the third transistor, and the fourth transistor may be included in a second portion 295 of the memory cell, and forming the memory cell may include or involve operations, features, circuitry, logic, means, or instructions for physically or electrically coupling the first transistor, the second transistor, the third transistor, or the fourth transistor, or a combination thereof, with a first portion 290 of the memory cell, including a physical or electrical coupling with one or more substrate-based transistors (e.g., a transistor 240, a transistor 240, one or more transistor structures 300).

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory cell including a plurality of transistors configured to store a logic state. The plurality of transistors may include a first set of one or more transistors each including a respective first gate portion including a conductor formed above a substrate, and a respective first channel portion including a pillar formed above the substrate and configured to be activated based at least in part on a voltage of the respective first gate portion. The plurality of transistors may also include a second set of one or more transistors each including a respective second gate portion including a conductor formed above the substrate, and a respective second channel portion including a doped portion of the substrate that is configured to be activated based at least in part on a voltage of the respective second gate portion In some examples of the apparatus, the respective first channel portion of each transistor of the first set of one or more transistors includes a plurality of pillars formed above the substrate.

In some examples of the apparatus, the pillars of the first channel portions of all of the first set of one or more transistors may have a common height dimension relative to the substrate.

In some examples of the apparatus, the first set of one or more transistors may include a first subset of transistors, where the pillar of the respective first channel portion of each transistor of the first subset may have a first height dimension relative to the substrate, and a second subset of transistors, where the pillar of the respective first channel portion of each transistor of the second subset may have a second height dimension relative to the substrate (e.g., different than the first height dimension).

In some examples of the apparatus, each transistor of the second set of one or more transistors may be configured in a planar transistor arrangement.

In some examples of the apparatus, each transistor of the first set of one or more transistors may be configured as an n-type transistor and each transistor of the second set of one or more transistors may be configured as a p-type transistor.

In some examples of the apparatus, the first set of one or more transistors includes four n-type transistors and the second set of one or more transistors includes two p-type transistors.

Another apparatus is described. The apparatus may include a memory array. The memory array may include a first memory cell including a first plurality of transistors, the first plurality of transistors including a first plurality of pillars each formed above a substrate of the memory array and each configured to be activated by a respective gate conductor formed above the substrate of the memory array. The memory array may also include a second memory cell including a second plurality of transistors, the second plurality of transistors including a second plurality of pillars each formed above the substrate of the memory array and each configured to be activated by a respective gate conductor formed above the substrate of the memory array In some examples of the apparatus, the first memory cell further includes a third plurality of transistors each including a respective doped portion of the substrate that are configured to be activated by a respective gate conductor, and the second memory cell further includes a fourth plurality of transistors each including a respective doped portion of the substrate that are configured to be activated by a respective gate conductor.

In some examples of the apparatus, each transistor of the first plurality of transistors and each transistor of the second plurality of transistors may be configured as an n-type transistor and each transistor of the third plurality of transistors and each transistor of the fourth plurality of transistors may be configured as a p-type transistor.

In some examples of the apparatus, each transistor of the first plurality of transistors includes a respective set of two or more of the first plurality of pillars and each transistor of the second plurality of transistors includes a respective set of two or more of the second plurality of pillars.

In some examples of the apparatus, each pillar of the first plurality of pillars and each pillar of the second plurality of pillars may have a common height relative to the substrate.

In some examples, the apparatus may include one or more pillars having the common height relative to the substrate and configured to not be activated by any gate conductor.

In some examples of the apparatus, the first plurality of pillars and the second plurality of pillars each include a respective first subset of pillars having a first height dimension relative to the substrate and a respective second subset of pillars having a second height dimension relative to the substrate.

In some examples, the apparatus may include one or more first pillars having the first height dimension relative to the substrate and configured to not be activated by any gate conductor and one or more second pillars having the second height dimension relative to the substrate and configured to not be activated by any gate conductor.

Another apparatus is described. The apparatus may include a memory cell. The memory cell may include a first transistor including a first gate portion coupled with a first access line and a first channel portion coupled between a second access line and a first node of the memory cell, the first channel portion including a first pillar formed over a substrate. The memory cell may also include a second transistor including a second gate portion coupled with a second node of the memory cell and a second channel portion coupled between the first node and a third node of the memory cell, the second channel portion including a second pillar formed over the substrate. The memory cell may also include a third transistor including a third gate portion coupled with the first node and a third channel portion coupled between the third node and the second node, the third channel portion including a third pillar formed over the substrate. The memory cell may also include a fourth transistor including a fourth gate portion coupled with the first access line and a fourth channel portion coupled between the second node and a third access line, the fourth channel portion including a fourth pillar formed over the substrate In some examples of the apparatus, the memory cell may also include a fifth transistor including a fifth gate portion coupled with the second node and a fifth channel portion coupled between the first node and a fourth node of the memory cell, the fifth channel portion including a first doped portion of the substrate. In some examples of the apparatus, the memory cell may also include a sixth transistor including a sixth gate portion coupled with the first node and a sixth channel portion coupled between the second node and the fourth node, the sixth channel portion including a second doped portion of the substrate.

In some examples of the apparatus, the third node may be configured to be coupled with a ground voltage source and the fourth node may be configured to be coupled with a positive voltage source.

In some examples of the apparatus, each of the fifth transistor and the sixth transistor may be configured as a p-type transistor.

In some examples of the apparatus, the first channel portion includes a plurality of first pillars, the second channel portion includes a plurality of second pillars, the third channel portion includes a plurality of third pillars, and the fourth channel portion includes a plurality of fourth pillars.

In some examples of the apparatus, each of the first transistor, the second transistor, the third transistor, and the fourth transistor may be configured as an n-type transistor.

In some examples of the apparatus, each of the first pillar, the second pillar, the third pillar, and the fourth pillar may have a first height dimension relative to the substrate.

In some examples of the apparatus, each of the first gate portion, the second gate portion, the third gate portion, and the fourth gate portion may include a respective conductor portion having a second height dimension relative to the substrate that is within the first height dimension.

In some examples of the apparatus, each of the first node and the second node may include a respective conductor portion having a third height dimension relative to the substrate that is within the first height dimension.

In some examples of the apparatus, the first access line includes a conductor portion having a fourth height dimension relative to the substrate that is within the first height dimension.

In some examples of the apparatus, each of the first pillar and the fourth pillar may have a first height dimension relative to the substrate and each of the second pillar and the third pillar may have a second height dimension relative to the substrate (e.g., different than the first height dimension).

In some examples of the apparatus, the first node may include a first conductive portion coupling the first pillar with the second pillar and having a third height dimension relative to the substrate that is between the first height dimension and the second height dimension, and the second node may include a second conductive portion coupling the third pillar with the fourth pillar and having a fourth height dimension relative to the substrate that is between the first height dimension and the second height dimension.

In some examples of the apparatus, the first access line includes a conductor portion having a fifth height dimension relative to the substrate that is within the first height dimension.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., when referring to an operation or action) refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate, where a channel portion may refer to a portion of the device electrically coupling the source and drain (e.g., coupled between the source and drain, operable to form or enable a conductive path between the source and drain). The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel portion becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
 a memory cell comprising a plurality of transistors configured to store a logic state, the plurality of transistors comprising:
  a first set of one or more transistors each comprising:
   a respective first gate portion comprising a first conductor formed above a substrate; and
   a respective first channel portion comprising a pillar formed above the substrate and configured to be activated based at least in part on a voltage of the respective first gate portion; and
  a second set of one or more transistors each comprising:
   a respective second gate portion comprising a second conductor formed above the substrate; and
   a respective second channel portion comprising a doped portion of the substrate that is configured to be activated based at least in part on a voltage of the respective second gate portion.

2. The apparatus of claim 1, wherein the respective first channel portion of each transistor of the first set of one or more transistors comprises a plurality of pillars formed above the substrate.

3. The apparatus of claim 1, wherein the pillars of the first channel portions of all of the first set of one or more transistors have a common height dimension relative to the substrate.

4. The apparatus of claim 1, wherein the first set of one or more transistors comprises:
- a first subset of transistors, wherein the pillar of the respective first channel portion of each transistor of the first subset of transistors has a first height dimension relative to the substrate; and
- a second subset of transistors, wherein the pillar of the respective first channel portion of each transistor of the second subset of transistors has a second height dimension relative to the substrate.

5. The apparatus of claim 1, wherein each transistor of the second set of one or more transistors is configured in a planar transistor arrangement.

6. The apparatus of claim 1, wherein:
- each transistor of the first set of one or more transistors is configured as an n-type transistor; and
- each transistor of the second set of one or more transistors is configured as a p-type transistor.

7. The apparatus of claim 6, wherein:
- the first set of one or more transistors comprises four n-type transistors; and
- the second set of one or more transistors comprises two p-type transistors.

8. A method, comprising:
- forming a memory cell comprising a plurality of transistors configured to store a logic state, wherein forming the memory cell comprises:
  - forming a first set of one or more transistors each comprising:
    - a respective first gate portion comprising a first conductor formed above a substrate; and
    - a respective first channel portion comprising a pillar formed above the substrate and configured to be activated based at least in part on a voltage of the respective first gate portion; and
  - forming a second set of one or more transistors each comprising:
    - a respective second gate portion comprising a second conductor formed above the substrate; and
    - a respective second channel portion comprising a doped portion of the substrate that is configured to be activated based at least in part on a voltage of the respective second gate portion.

9. The method of claim 8, wherein the respective first channel portion of each transistor of the first set of one or more transistors comprises a plurality of pillars formed above the substrate.

10. The method of claim 8, wherein the pillars of the channel portions of all of the first set of one or more transistors are formed with a common height dimension relative to the substrate.

11. The method of claim 8, wherein the first set of one or more transistors comprises:
- a first subset of transistors, wherein the pillar of the respective first channel portion of each transistor of the first subset of transistors is formed with a first height dimension relative to the substrate; and
- a second subset of transistors, wherein the pillar of the respective first channel portion of each transistor of the second subset of transistors is formed with a second height dimension relative to the substrate.

12. The method of claim 8, wherein each transistor of the second set of one or more transistors is formed in a planar transistor arrangement.

13. The method of claim 8, wherein:
- each transistor of the first set of one or more transistors is formed as an n-type transistor; and
- each transistor of the second set of one or more transistors is formed as a p-type transistor.

14. The method of claim 13, wherein:
- the first set of one or more transistors comprises four n-type transistors; and
- the second set of one or more transistors comprises two p-type transistors.

\* \* \* \* \*